(12) United States Patent
Okabe et al.

(10) Patent No.: US 12,167,624 B2
(45) Date of Patent: Dec. 10, 2024

(54) DISPLAY DEVICE INCLUDING SEPARATION WALL HAVING CANOPY-SHAPED METAL LAYER

(71) Applicant: SHARP KABUSHIKI KAISHA, Sakai (JP)

(72) Inventors: Tohru Okabe, Sakai (JP); Shinsuke Saida, Sakai (JP); Ryosuke Gunji, Sakai (JP); Shinji Ichikawa, Sakai (JP); Hiroharu Jinmura, Yonago (JP); Akira Inoue, Yonago (JP); Yoshihiro Nakada, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 581 days.

(21) Appl. No.: 17/432,739

(22) PCT Filed: Feb. 27, 2019

(86) PCT No.: PCT/JP2019/007578
§ 371 (c)(1),
(2) Date: Aug. 20, 2021

(87) PCT Pub. No.: WO2020/174612
PCT Pub. Date: Sep. 3, 2020

(65) Prior Publication Data
US 2022/0020958 A1    Jan. 20, 2022

(51) Int. Cl.
*H10K 50/84* (2023.01)
*H10K 50/844* (2023.01)
(Continued)

(52) U.S. Cl.
CPC ......... *H10K 50/844* (2023.02); *H10K 50/841* (2023.02); *H10K 59/12* (2023.02);
(Continued)

(58) Field of Classification Search
CPC .... H10K 50/844; H10K 50/841; H10K 50/84; H10K 50/15; H10K 50/16; H10K 50/17;
(Continued)

(56) References Cited

U.S. PATENT DOCUMENTS

2006/0197086 A1 * 9/2006 Rhee ............... H10K 59/122
                                                    257/E29.147
2007/0188093 A1   8/2007 Nagara et al.
(Continued)

FOREIGN PATENT DOCUMENTS

JP         2007-250520 A       9/2007
WO    WO-2018179035 A1 * 10/2018 ............... G09F 9/30
(Continued)

*Primary Examiner* — Ida M Soward
(74) *Attorney, Agent, or Firm* — ScienBiziP, P.C.

(57) ABSTRACT

A display device includes: a base substrate; a thin-film transistor layer provided on the base substrate, a light-emitting element layer provided on the thin-film transistor layer; and a sealing film provided on the light-emitting element. Each of light-emitting elements includes: a first electrode; a functional layer; and a second electrode stacked on top of another in a stated order. The display device includes: a display region; a frame region; and a non-display region. The non-display region includes a through hole. The display device includes a separation wall shaped into a frame and provided to the non-display region along an edge of the through hole. The separation wall includes: a first resin layer: and a first metal layer provided on the first resin layer. The first metal layer includes a first protrusion shaped into a canopy, and protruding from the first resin layer toward the display region.

20 Claims, 13 Drawing Sheets

(51) Int. Cl.
*H10K 59/12* (2023.01)
*G06F 1/16* (2006.01)
*G09F 9/30* (2006.01)
*H10K 50/15* (2023.01)
*H10K 50/16* (2023.01)
*H10K 50/17* (2023.01)
*H10K 59/121* (2023.01)
*H10K 77/10* (2023.01)
*H10K 102/00* (2023.01)

(52) U.S. Cl.
CPC ............ *G06F 1/1652* (2013.01); *G09F 9/301* (2013.01); *H05K 2201/09909* (2013.01); *H10K 50/15* (2023.02); *H10K 50/16* (2023.02); *H10K 50/17* (2023.02); *H10K 50/171* (2023.02); *H10K 59/1213* (2023.02); *H10K 77/111* (2023.02); *H10K 2102/311* (2023.02)

(58) Field of Classification Search
CPC .... H10K 50/171; H10K 59/12; H10K 59/122; H10K 59/124; H10K 59/1213; H10K 77/111; H05B 33/02; H05B 33/04; G09F 9/00; G09F 9/30
See application file for complete search history.

(56) References Cited

U.S. PATENT DOCUMENTS

| | | | |
|---|---|---|---|
| 2017/0031323 A1* | 2/2017 | Kim | H10K 59/1213 |
| 2018/0033832 A1* | 2/2018 | Park | G06F 3/0443 |
| 2018/0287094 A1* | 10/2018 | Nakajima | H10K 50/8426 |
| 2019/0165312 A1* | 5/2019 | Bae | G09G 3/20 |
| 2019/0245015 A1* | 8/2019 | Lee | H10K 50/8426 |
| 2019/0363267 A1* | 11/2019 | Tanaka | H05B 33/02 |
| 2019/0363275 A1* | 11/2019 | Ochi | H10K 50/125 |
| 2019/0363290 A1* | 11/2019 | Watanabe | H10K 59/8731 |

FOREIGN PATENT DOCUMENTS

| | | | | |
|---|---|---|---|---|
| WO | WO-2018179047 A1 * | 10/2018 | | G09F 9/30 |
| WO | WO-2018179308 A1 * | 10/2018 | | G09F 9/301 |
| WO | WO-2018229991 A1 * | 12/2018 | | G09F 9/30 |

* cited by examiner

DISPLAY DEVICE INCLUDING SEPARATION WALL HAVING CANOPY-SHAPED METAL LAYER

TECHNICAL FIELD

The disclosure relates to a display device.

BACKGROUND ART

In recent years, light-emitting organic electroluminescence (EL) display devices using organic EL elements are drawing attention as a replacement for liquid crystal display devices. An organic EL element includes, for example, an organic EL layer including a light-emitting layer, a first electrode provided to one surface of the organic EL layer, and a second electrode provided to an other surface of the organic EL layer.

For example, Patent Document 1 discloses an organic EL display panel including an organic EL layer and a second electrode formed by vapor deposition and separated from each other with a reverse-tapered partition wall.

CITATION LIST

Patent Literature

Patent Document 1: Japanese Unexamined Patent Application Publication No. 2007-250520

SUMMARY OF INVENTION

Technical Problems

In an organic EL display device, the display region to display an image desirably includes therein a non-display region shaped into an island for installation of, for example, a camera and a fingerprint sensor. The non-display region is desirably provided with a through hole penetrating along the thickness of the non-display region. However, the display region includes a common functional layer formed by vapor deposition. Hence, if the above through hole is provided inside the display region, such foreign objects as water might enter the display region through the common functional layer exposed from the through hole. Since the foreign objects cause deterioration of an organic EL layer included in an organic EL element, the common functional layer needs to be formed around the through hole and separately toward the display region and toward the through hole. Note that it is technically difficult to produce a shadow mask in a manner that the common functional layer is not formed in and around the through hole of the display region. Here, in order to form the common functional layer separately toward the display region and toward the through hole, it might be beneficial to use a reverse-tapered structure described in Patent Document 1. However, the reverse-tapered structure requires a negatively photosensitive material, increasing manufacturing costs. Hence, Patent Document 1 still has room to improve.

In view of the above problems, the disclosure is intended to form a common functional layer separately toward a display region and toward a through hole at low costs.

Solution to Problems

In order to achieve the above intension, a display device according to the disclosure includes: a base substrate; a thin-film transistor layer provided on the base substrate, including at least one first inorganic insulating film, and having a surface on which a planarization film is stacked; a light-emitting element layer in which a plurality of light-emitting elements are arranged, the light-emitting element layer being provided on the thin-film transistor layer; and a sealing film including at least one second inorganic insulating film, and provided on the light-emitting element. Each of the light-emitting elements includes: a first electrode; a functional layer; and a second electrode stacked on top of an other in a stated order. The display device includes: a display region defined to display an image; a frame region defined around the display region; and a non-display region defined inside the display region and shaped into an island. The non-display region including a through hole penetrating the non-display region along a thickness of the base substrate. The display device includes a separation wall shaped into a frame and provided to the non-display region along an edge of the through hole. The separation wall includes: a first resin layer formed of the same material, and in the same layer, as the planarization film is; and a first metal layer formed of the same material, and in the same layer, as the first electrode is, and provided on the first resin layer. The first metal layer includes a first protrusion shaped into a canopy, and protruding from the first resin layer toward the display region.

Advantageous Effects of Disclosure

Thanks to the disclosure, the separation wall includes: the first resin layer formed of the same material, and in the same layer, as the planarization film is; and the first metal layer formed of the same material, and in the same layer, as the first electrode is, and provided on the first resin layer. The first metal layer includes a first protrusion shaped into a canopy, and protruding from the first resin layer toward the display region. Such features make it possible to form the common functional layer separately toward the display region and toward the through hole at low costs.

DESCRIPTION OF EMBODIMENTS

Described below in derail are embodiments of the disclosure, with reference to the drawings. Note that the disclosure shall not be limited to these embodiments.

FIRST EMBODIMENT

Figure 1:
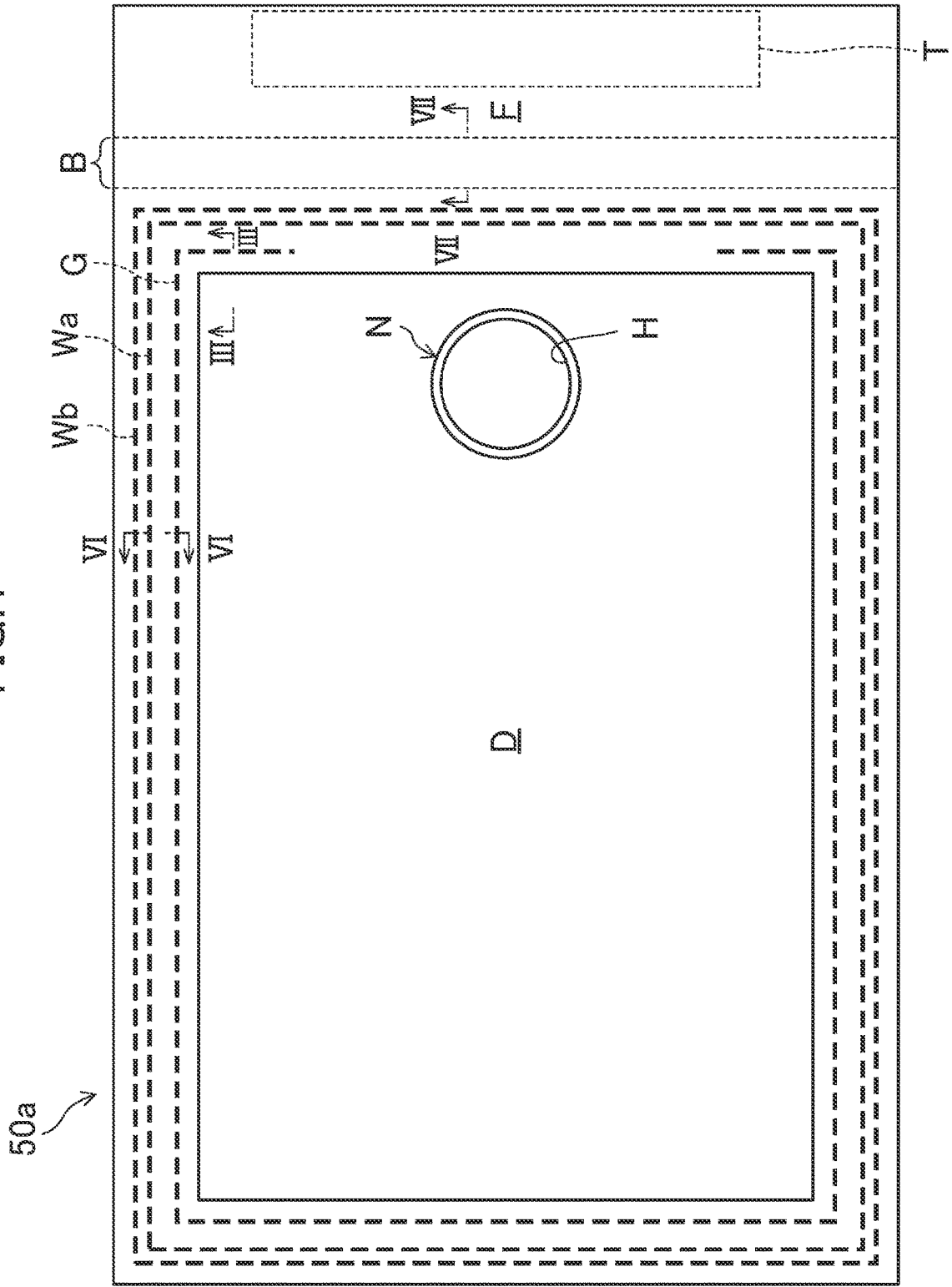
FIG. 1 is a plan view illustrating a schematic configuration of an organic EL display device according to a first embodiment of the disclosure.
Figure 2:
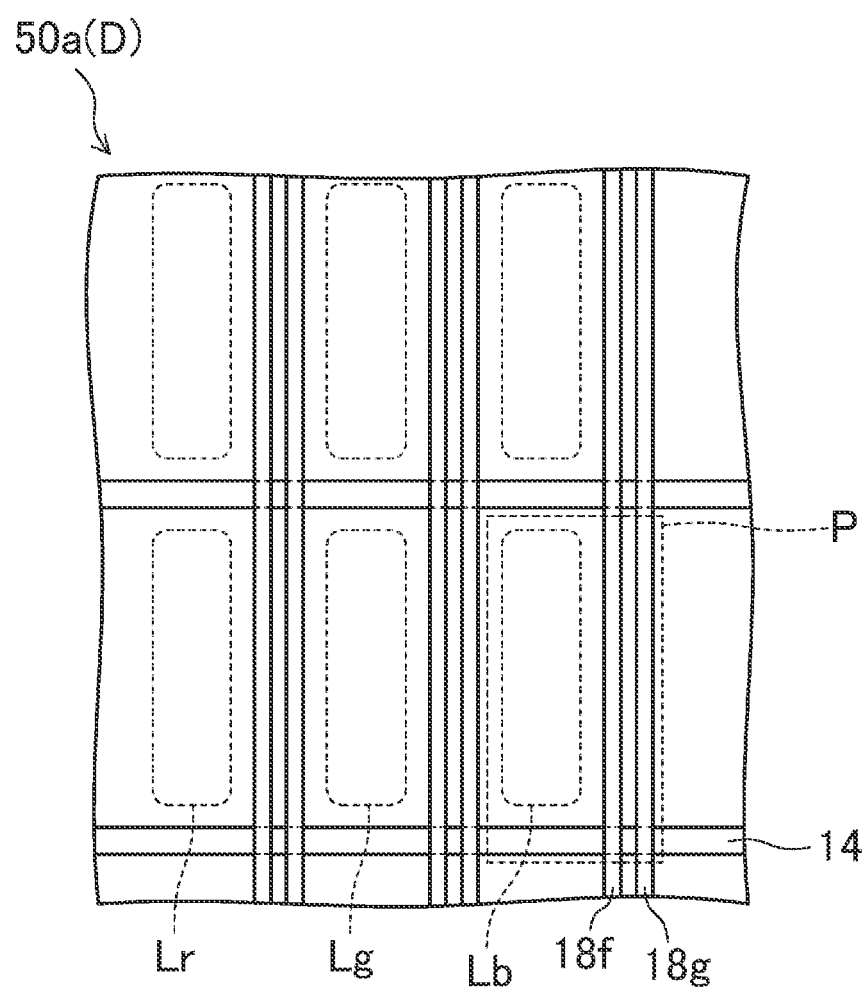
FIG. 2 is a plan view illustrating a display region of the organic EL display device according to the first embodiment of the disclosure.
Figure 3:
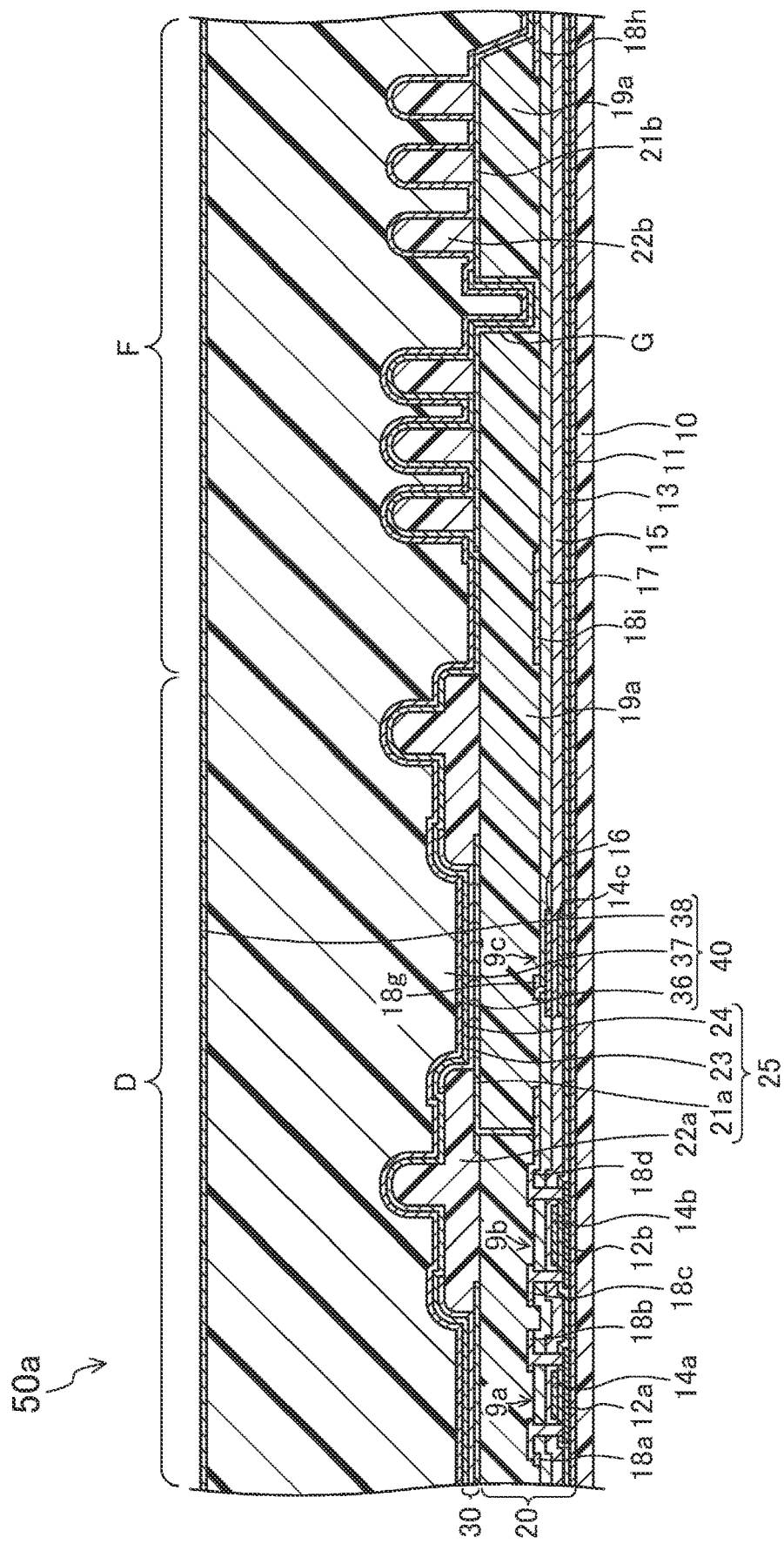
FIG. 3 is a cross-sectional view of the organic EL display device, taken from line III-III in FIG. 1.
Figure 4:
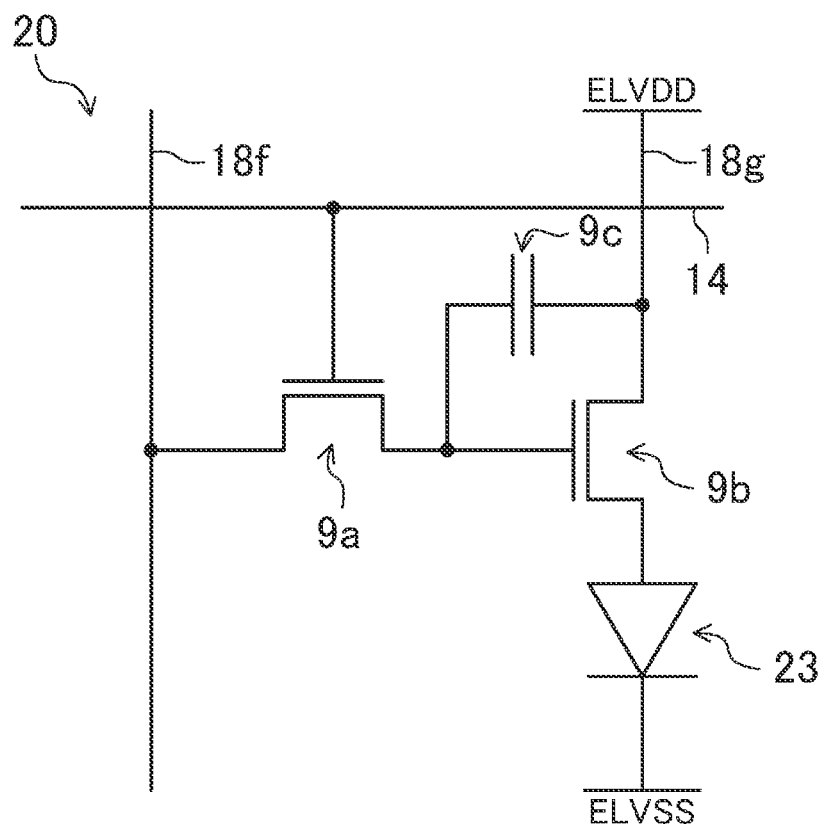
FIG. 4 is an equivalent circuit diagram illustrating a thin-film transistor (TFT) layer included in the organic EL display device according to the first embodiment of the disclosure.
Figure 5:
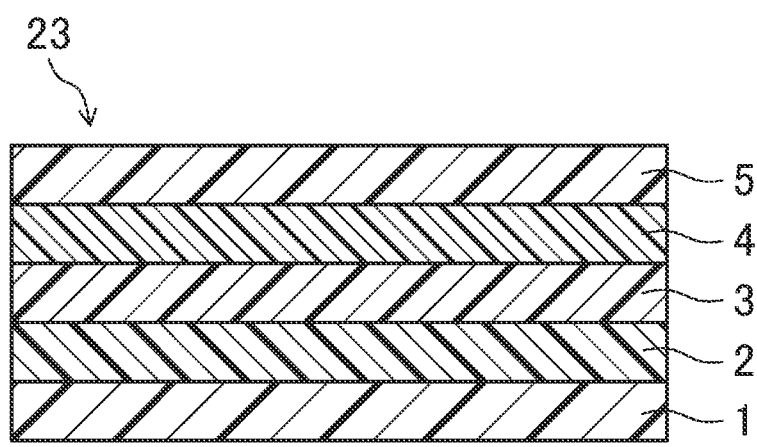
FIG. 5 is a cross-sectional view illustrating an organic EL layer included in the organic EL display device according to the first embodiment of the disclosure.
Figure 6:
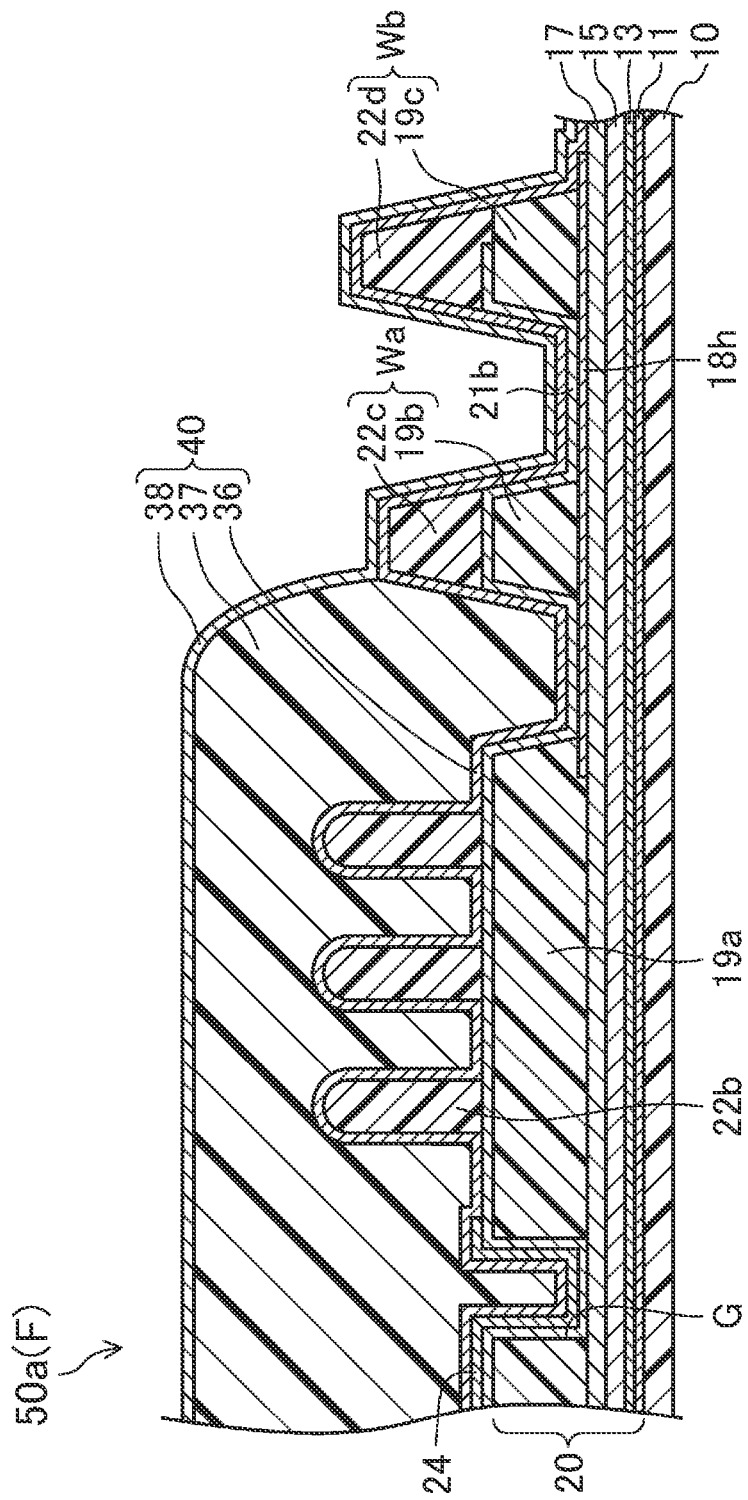
FIG. 6 is a cross-sectional view of a frame region included in the organic EL display device, taken from line VI-VI in FIG. 1.
Figure 7:
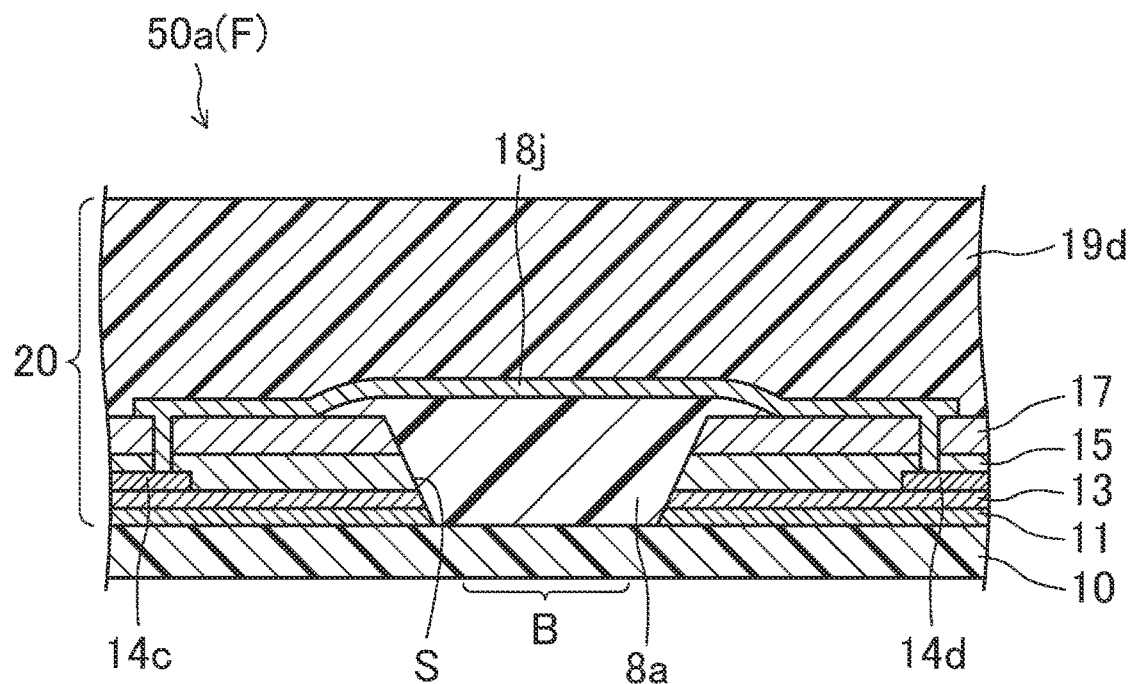
FIG. 7 is a cross-sectional view of the frame region included in the organic EL display device, taken from line VII-VII in FIG. 1.
Figure 8:
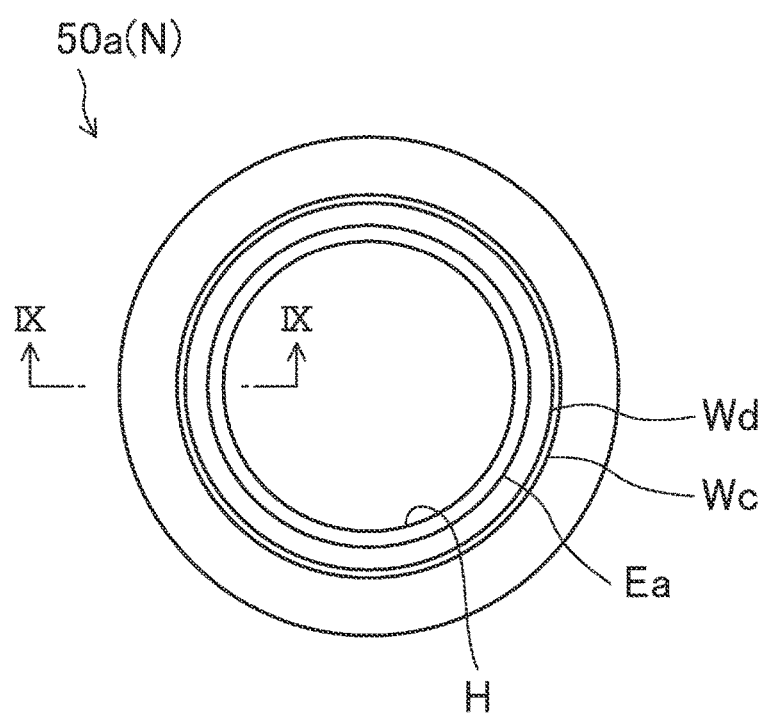
FIG. 8 is a plan view illustrating a non-display region of the organic EL display device according to the first embodiment of the disclosure.
Figure 9:
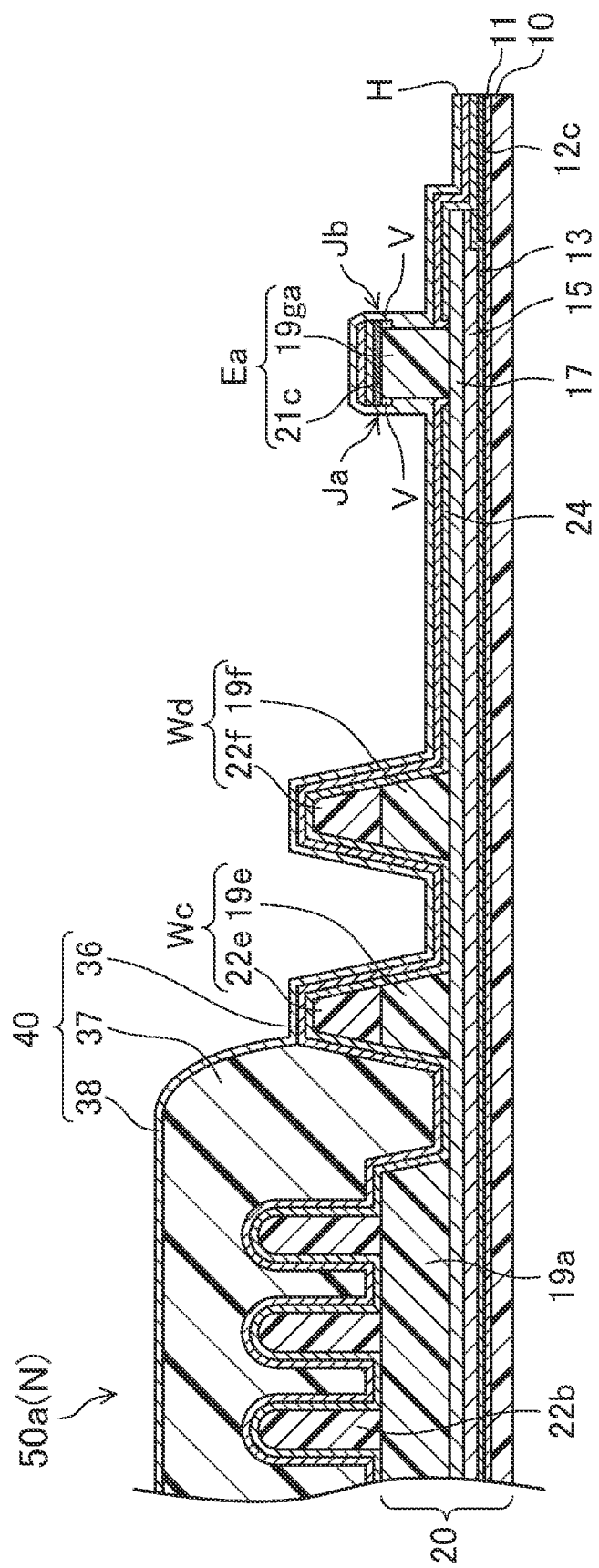
FIG. 9 is a cross-sectional view of the non-display region of the organic EL display device, taken from line IX-IX in FIG. 8.

FIGS. 1 to 16 illustrate a first embodiment of a display device according to the disclosure. The embodiments below exemplify an organic EL display device including an organic EL element, as a display device including a light-emitting element. FIG. 1 is a plan view illustrating a schematic configuration of an organic EL display device 50*a* according to this embodiment. FIG. 2 is a plan view illustrating a display region D of the organic EL display device 50*a*. FIG. 3 is a cross-sectional view of the organic EL display device 50*a*, taken from line III-III in FIG. 1. FIG. 4 is an equivalent circuit diagram illustrating a TFT layer 20 included in the organic EL display device 50*a*. FIG. 5 is a cross-sectional view illustrating an organic EL layer 23 included in the organic EL display device 50*a*. FIGS. 6 and 7 are cross-sectional views of a frame region F included in the organic EL display device 50*a*, taken from lines VI-VI and VII-VII in FIG. 1. FIG. 8 is a plan view illustrating a non-display region N of the organic EL display device 50*a*. FIG. 9 is a cross-sectional view of the non-display region N of the organic EL display device 50*a*, taken from line IX-IX in FIG. 8.

As illustrated in FIG. 1, the organic EL display device 50*a* includes, for example: the display region D shaped into a rectangle and displaying an image; and the frame region F shaped into a rectangular frame and provided around the display region D. Note that, in this embodiment, the display area D is, for example, rectangular. Examples of the rectangle include such substantial rectangles as a rectangle having arc-like sides, a rectangle having rounded corners, and a rectangle having partially notched sides.

As illustrated in FIG. 2, the display region D includes a plurality of sub-pixels P arranged in a matrix. In the display region D, as illustrated in FIG. 2, for example, the sub-pixels P having red light-emitting areas Lr representing red, the sub-pixels P having green light-emitting areas Lg representing green, and the sub-pixels P having blue light-emitting areas Lb representing blue are provided next to each other. Note that, in the display region D, for example, neighboring three of the sub-pixels P each having one of a red light-emitting area Lr, a green light-emitting area Lg, and a blue light-emitting area Lb constitute one pixel. As illustrated in FIG. 1, the display region D includes therein the non-display region N shaped into an island. Here, as illustrated in FIG. 1, the non-display region N is provided with a through hole H penetrating the non-display region N along the thickness of a resin substrate layer 10 to be described later. Note that a detailed structure of the non-display region N will be described later, with reference to FIGS. 8 and 9.

In FIG. 1, the frame area F has a right end provided with a terminal T extending in one direction (i.e. in a vertical direction in the drawing). As illustrated in FIG. 1, the frame region F includes a fold portion B provided to the terminal T toward the display area D. The fold portion B, extending in a single direction (a vertical direction in the drawing), is foldable around a folding axis in a vertical direction at an angle of, for example, 180° (foldable in a U-shape). Here, in the frame region F, a planarization film 19*a* to be described later is provided with a trench G shaped into a substantial C-shape and penetrating the planarization film 19*a* as illustrated in FIGS. 1, 3, and 6. Note that, as illustrated in FIG. 1, the trench G is laid into a substantial C-shape to open toward the terminal T in planar view.

As illustrated in FIGS. 3, 6, 7, and 9, the organic EL display device 50*a* includes: a resin substrate layer 10 provided as a base substrate; the TFT layer 20 provided on the resin substrate layer 10; an organic EL element layer 30 provided on the TFT layer 20; and a sealing film 40 provided on the organic EL element layer 30.

The resin substrate layer 10 is made of, for example, polyimide resin.

As illustrated in FIG. 3, the TFT layer 20 includes: a base coat film 11 provided on the resin substrate layer 10 and serving as a first inorganic insulating film; a plurality of first TFTs 9*a*, a plurality of second TFTs 9*b*, and a plurality of capacitors 9*c* provided on the base coat film 11; and the planarization film 19*a* provided on, and stacked on surfaces of, the first TFTs 9*a*, the second TFTs 9*b*, and the capacitors 9*c*. As illustrated in FIGS. 2 and 4, the TFT layer 20 includes a plurality of gate lines 14 horizontally extending in parallel with one an other in the drawings. Moreover, as illustrated in FIGS. 2 and 4, the TFT layer 20 includes a plurality of supply lines 18*f* vertically extending in parallel with one an other in the drawings. Furthermore, as illustrated in FIGS. 2 and 4, the TFT layer 20 includes a plurality of power supply lines 18*g* vertically extending in parallel with one an other in the drawings. As illustrated in FIG. 2, the power supply lines 18*g* and the supply lines 18*f* are provided next to each other. In the TFT layer 20, as illustrated in FIG. 4, each of the sub-pixels P includes a first TFT 9*a*, a second TFT 9*b*, and a capacitor 9*c*.

The base coat film 11 is, for example, a monolayer inorganic insulating film made of such materials as silicon nitride, silicon oxide, and silicon oxide nitride, or a multilayer inorganic insulating film made of these materials.

As illustrated in FIG. 4, in each sub-pixel P, the first TFT 9a is electrically connected to the corresponding gate line 14 and supply line 18f. The first TFT 9a illustrated in FIG. 3 includes: a semiconductor layer 12a; a gate insulating film 13; a gate electrode 14a; a first interlayer insulating film 15; a second interlayer insulating film 17; and a supply electrode 18a and a drain electrode 18b all of which are provided on the base coat film 11 in the stated order. The semiconductor layer 12a illustrated in FIG. 3 is, for example, made of low-temperature-polysilicon film, shaped into an island, and provided on the base coat film 11. The semiconductor layer 12a includes a channel region, a supply region, and a drain region. The gate insulating film 13 illustrated in FIG. 3 is provided as a first inorganic insulating film to cover the semiconductor layer 12a. The gate electrode 14a illustrated in FIG. 3 is provided on the gate insulating film 13 to overlap the channel region of the semiconductor layer 12a. The first interlayer insulating film 15 and the second interlayer insulating film 17 illustrated in FIG. 3 are provided in the stated order as the first inorganic insulating film to cover the gate electrode 14a. The source electrode 18a and the drain electrode 18b illustrated in FIG. 3 are spaced apart from each other on the second interlayer insulating film 17. As illustrated in FIG. 3, the source electrode 18a and the drain electrode 18b are respectively and electrically connected to the source region and the drain region of the semiconductor layer 12a through contact holes each formed in a multilayer film including the gate insulating film 13, the first interlayer insulating film 15, and the second interlayer insulating film 17. Note that the gate insulating film 13, the first interlayer insulating film 15, and the second interlayer insulating film 17 are, for example, a monolayer inorganic insulating film made of such materials as silicon nitride, silicon oxide, and silicon oxide nitride, or a multilayer inorganic insulating film made of these materials.

As illustrated in FIG. 4, in each sub-pixel P, the second TFT 9b is electrically connected to the corresponding first TFT 9a and power supply line 18g. The second TFT 9b illustrated in FIG. 3 includes: a semiconductor layer 12b; the gate insulating film 13; a gate electrode 14b; the first interlayer insulating film 15; the second interlayer insulating film 17; and a source electrode 18c and a drain electrode 18d all of which are provided on the base coat film 11 in the stated order. The semiconductor layer 12b illustrated in FIG. 3 is, for example, made of low-temperature-polysilicon film, shaped into an island, and provided on the base coat film 11. The semiconductor layer 12b includes a channel region, a source region, and a drain region. The gate insulating film 13 illustrated in FIG. 3 is provided to cover the semiconductor layer 12b. The gate electrode 14b illustrated in FIG. 3 is provided on the gate insulating film 13 to overlap the channel region of the semiconductor layer 12b. The first interlayer insulating film 15 and the second interlayer insulating film 17 illustrated in FIG. 3 are provided in the stated order to cover the gate electrode 14b. The source electrode 18c and the drain electrode 18d illustrated in FIG. 3 are spaced apart from each other on the second interlayer insulating film 17. As illustrated in FIG. 3, the source electrode 18c and the drain electrode 18d are respectively and electrically connected to the source region and the drain region of the semiconductor layer 12b through contact holes each formed in a multilayer film including the gate insulating film 13, the first interlayer insulating film 15, and the second interlayer insulating film 17.

Note that, as an example, the first TFTs 9a and the second TFTs 9b in this embodiment are top gate TFTs. Alternatively, the first TFTs 9a and the second TFTs 9b may be bottom gate TFTs.

As illustrated in FIG. 4, in each sub-pixel P, the capacitor 9c is electrically connected to the corresponding first TFT 9a and power supply line 18g. The capacitor 9c illustrated in FIG. 3 includes: a lower conductive layer 14c formed of the same material, and in the same layer, as the gate electrodes 14a and 14b are; the first interlayer insulating film 15 provided to cover the lower conductive layer 14c; and an upper conductive layer 16 provided on the first interlayer insulating film 15 to overlap the lower conductive layer 14c. Note that the upper conductive layer 16 illustrated in FIG. 3 is electrically connected to the power supply line 18g through a contact hole formed in the second interlayer insulating film 17.

The planarization film 19a is made of, for example, a positively photosensitive resin such as polyimide resin.

The organic EL element layer 30 illustrated in FIG. 3 includes a plurality of organic EL elements 25 as a plurality of light-emitting elements provided on the planarization film 19a and arranged in a matrix.

Each of the organic EL elements 25 illustrated in FIG. 3 includes: a first electrode 21a provided on the planarization film 19a; the organic EL layer 23 provided on the first electrode 21a and serving as a functional layer; and a second electrode 24 provided on the organic EL layer 23 in common among the sub-pixels P.

As illustrated in FIG. 3, the first electrode 21a is electrically connected to the drain electrode 18d of the second TFT 9b in each sub-pixel P through a contact hole formed in the planarization film 19a. The first electrode 21a is capable of injecting holes into the organic EL layer 23. Preferably, the first electrode 21a is formed of a material having a high work function in order to improve efficiency in injecting the holes into the organic EL layer 23. Exemplary materials of the first electrode 21a include such metal materials as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the exemplary materials of the first electrode 21a may also include an alloy of astatine (At)/astatine dioxide ($AtO_2$). Furthermore, exemplary materials of the first electrode 21a may include such conductive oxides as tin oxide (SnO), zinc oxide (ZnO), indium tin oxide (ITO), and indium zinc oxide (IZO). The first electrode 21a may be a multilayer including two or more layers made of the above materials. Exemplary compound materials having a large work function include indium tin oxide (ITO) and indium zinc oxide (IZO). Furthermore, the first electrode 21a has a peripheral end covered with an edge cover 22a formed in a grid and provided in common among the sub-pixels P. Exemplary materials of the edge cover 22a include such positively photosensitive resins as polyimide resin, acrylic resin, polysiloxane resin, and novolak resin. The edge cover 22a illustrated in FIG. 3 has a surface partially serving as a pixel photo spacer. In FIG. 3, the pixel photo spacer is shaped into an island and protrudes upward.

As illustrated in FIG. 5, the organic EL layer 23 includes: a hole-injection layer 1; a hole-transport layer 2; a light-emitting layer 3; an electron-transport layer 4; and an electron-injection layer 5 all of which are provided one after an other on the first electrode 21a in the stated order.

The hole injection layer 1, also referred to as an anode buffer layer, is capable of approximating the energy levels of the first electrode 21a and the organic EL layer 23 and increasing efficiency in injection of the holes from the first electrode 21a to the organic EL layer 23. The hole injection layer 1 serves as a common functional layer provided in common among the sub-pixels P. Exemplary materials of the hole injection layer 1 may include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives. Note that the common functional layer is a functional layer formed, using a common metal mask (CMM). This CMM, having one opening for one display device, cannot form a pattern to mask a region corresponding to the through hole. Hence, the common functional layer is inevitably vapor-deposited on the region corresponding to the through hole. In contrast, an individual functional layer is a functional layer formed, using a fine metal mask (FMM). This FMM is provided with openings each for one of colors (e.g. including a functional layer in common with red and green). Moreover, the functional layer includes, other than the above hole-injection layer, the hole-transport layer 2, the light-emitting layer 3, the electron-transport layer 4, the electron-injection layer 5, a blocking layer, and a cap layer.

The hole-transport layer 2 is capable of improving efficiency in transporting the holes from the first electrode 21a to the organic EL layer 23. The hole-transport layer 2 serves as a common functional layer provided in common among the sub-pixels P. Exemplary materials of the hole transport-layer 2 may include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region into which the holes and the electrons are injected from the first electrode 21a and the second electrode 24 and recombine with each other, when a voltage is applied by the first electrode 21a and the second electrode 24. This light-emitting layer 3 is formed of a material with high light emission efficiency. Exemplary materials of the light-emitting layer 3 may include metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron-transport layer 4 is capable of efficiently transporting the electrons to the light-emitting layer 3. The electron-transport layer 4 serves as a common functional layer provided in common among the sub-pixels P. Exemplary materials of the electron-transport layer 4 may include, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron-injection layer 5 is capable of approximating the energy levels of the second electrode 24 and the organic EL layer 23, and increasing efficiency in injection of the electrons from the second electrode 24 to the organic EL layer 23. Such a feature makes it possible to decrease a drive voltage of the organic EL element 25. The electron-injection layer 5, also referred to as a cathode buffer layer, serves as a common functional layer provided in common among the sub-pixels P. Exemplary materials of the electron-injection layer 5 may include: such inorganic alkaline compounds as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

Note that the above common functional layers are examples, and any of the layers may be an individual layer. Moreover, for example, the light-emitting layer may be a common functional layer when the display device causes the light-emitting layer, emitting ultraviolet light and blue light, to convert color with, for example, quantum-dot light emitting diodes (QLEDs).

As illustrated in FIG. 3, the second electrode 24 is provided to cover each organic EL layer 23 and the edge cover 22a. The second electrode 24 is capable of injecting electrons into the organic EL layer 23. Preferably, the second electrode 24 is made of a material having a low work function in order to improve efficiency in injection of the electrons into the organic EL layer 23. Exemplary materials of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of, for example, an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 24 may also be formed of such conductive oxides as tin oxide (SnO), zinc oxide (ZnO), indium tin oxide (ITO), and indium zinc oxide (IZO). The second electrode 24 may be a multilayer including two or more layers made of the above materials. Exemplary materials having a low work function include magnesium (Mg), lithium (Li), lithium fluoride (LiF), magnesium (Mg)/copper (Cu), magnesium(Mg)/silver (Ag), sodium (Na)/potassium (K), lithium (Li)/aluminum (Al), lithium (Li)/calcium (Ca)/aluminum (Al), and fluoride (LiF)/calcium (Ca)/aluminum (Al).

As illustrated in FIGS. 3, 6, 7 and 9, the sealing film 40 includes: a lower second inorganic insulating film 36 provided to cover the second electrode 24; an organic insulating film 37 provided on the lower second inorganic insulating film 36; and an upper second inorganic insulating film 38 provided to cover the organic insulating film 37. The sealing film 40 is capable of protecting the organic EL layers 23 from such substances as water and oxygen. The lower second inorganic insulating film 36 and the upper second inorganic insulating film 38 are made of such inorganic materials as silicon dioxide ($SiO_2$), aluminum oxide ($Al_2O_3$), silicon nitride ($SiN_x$ (where x is a positive integer)) such as trisilicon tetranitride ($Si_3N_4$), and silicon carbide nitride (SiCN). Exemplary materials of the organic insulating film 37 include such organic materials as acrylic resin, polyuria resin, parylene resin, polyimide resin, and polyamide resin.

Moreover, as illustrated in FIG. 1, the organic EL display device 50a includes in the frame region F: an outer first dam wall Wa surrounding the display region D and shaped into a frame to overlap a peripheral end of the organic insulating film 37; and an outer second dam wall Wb shaped into a frame and surrounding the first dam wall Wa.

As illustrated in FIG. 6, the outer first dam wall Wa includes: a first lower resin layer 19b formed of the same material, and in the same layer, as the planarization film 19a is; and a first upper resin layer 22c provided above the first lower resin layer 19b through a first conductive layer 21b, and formed of the same material, and in the same layer, as the edge cover 22a is. Here, as illustrated in FIG. 6, the first conductive layer 21b is provided in the frame region F and shaped into a substantial C-shape to coincide with the trench G, the first bank wall Wa, and the second bank wall Wb. Note that the first conductive layer 21b is formed of the same material, and in the same layer, as the first electrodes 21a is.

As illustrated in FIG. 6, the outer second dam wall Wb includes: a second lower resin layer 19c formed of the same material, and in the same layer, as the planarization film 19a is; and a second upper resin layer 22d provided above the second lower resin layer 19c through the first conductive layer 21b, and formed of the same material, and in the same layer, as the edge cover 22a is.

Furthermore, as illustrated in FIGS. 3 and 6, the organic EL display device 50a includes, in the frame region F, a first frame wire 18h shaped into a substantial C-shape and provided outside the trench G to surround the display region D and coincide with the first bank wall Wa and the second bank wall Wb. In the terminal T, the first frame wire 18h is electrically connected to a power supply terminal receiving a low power-supply voltage (ELVSS). Moreover, as illustrated in FIG. 6, the first frame wire 18h is electrically connected to the second electrode 24 through the first conductive layer 21b.

Furthermore, as illustrated in FIG. 3, the organic EL display device 50a includes, in the frame area F, a second frame wire 18i shaped into a substantial C-shape and laid behind the trench G. In the terminal T, the second frame wire 18i is electrically connected to a terminal receiving a high power-supply voltage (ELVDD). Moreover, near the display area D, the second frame wire 18i is electrically connected to the power supply lines 18g arranged in the display area D.

In addition, as illustrated in FIG. 7, the organic EL display device 50a includes in the fold portion B: a lower planarization film 8a provided to fill a slit S formed in the base coat film 11, the gate insulating film 13, the first interlayer insulating film 15, and the second interlayer insulating film 17; a plurality of routed wires 18j provided on the lower planarization film 8a and the second interlayer insulating film 17; and a wire coating layer 19d provided to cover the routed wires 18j.

The slit S illustrated in FIG. 7 is shaped into a groove penetrating the base coat film 11, the gate insulating film 13, the first interlayer insulating film 15, and the second interlayer insulating film 17. The slit S runs in a direction in which the fold portion B extends to expose a surface of the resin substrate layer 10.

The lower planarization film 8a is made of, for example, such an organic resin material as polyimide resin.

The routed wires 18j, running in parallel with one another, are provided orthogonally to a direction in which the fold portion B extends. Here, as illustrated in FIG. 7, each of the routed wires 18j has opposing ends. Through contact holes formed in a multilayer film including the first interlayer insulating film 15 and the second interlayer insulating film 17, one of the opposing ends is electrically connected to a first gate conductive layer 14c and an other one of the opposing ends is electrically connected to a second gate conductive layer 14d. Note that the routed wires 18j are formed of the same material, and in the same layer, as the source lines 18f are. The first gate conductive layer 14c illustrated in FIG. 7 is provided between the gate insulating film 13 and the first interlayer insulating film 15, and electrically connected to such signal lines as the gate lines 14 and the source lines 18f extending to the display region D. The second gate conductive layer 14d illustrated in FIG. 7 is provided between the gate insulating film 13 and the first interlayer insulating film 15, and electrically connected to, for example, a signal terminal of the terminal unit T. The wire coating layer 19d is formed of the same material, and in the same layer, as the planarization film 19a is.

As illustrated in FIGS. 3, 6 and 9, the organic EL display device 50a includes, in the frame region F and the non-display region N, a plurality of peripheral photo spacers 22b each shaped into an island, provided on the planarization film 19a, and protruding upward in the drawings. Here, the peripheral photo spacers 22b are formed of the same material, and in the same layer, as the edge cover 22a is. Note that the peripheral photo spacers 22b may be a multilayer including: a resin layer formed of the same material, and in the same layer, as the edge cover 22a is; and an other resin layer.

Furthermore, as illustrated in FIGS. 8 and 9, the organic EL display device 50a includes, in the non-display region N, a separation wall Ea shaped into a frame and provided along an edge of the through hole H.

The separation wall Ea illustrated in FIG. 9 includes: a first resin layer 19ga provided on the second interlayer insulating film 17; and a first metal layer 21c provided on the first resin layer 19ga. The first resin layer 19ga is formed of the same material, and in the same layer, as the planarization film 19a is. Moreover, the first metal layer 21c is formed of the same material, and in the same layer, as the first electrode 21a is. Furthermore, as illustrated in FIG. 9, the first metal layer 21c includes: a first protrusion Ja shaped into a canopy and protruding from the first resin layer 19ga toward the display region D; and a second protrusion Jb shaped into a canopy and protruding from the first resin layer 19ga toward the through hole H. In addition, as illustrated in FIG. 9, the second electrode 24 (the hole-injection layer 1, the hole-transport layer 2, the electron-transport layer 4, and the electron-injection layer 5) is provided on the first metal layer 21c from the display region D to the through hole H, and separated at the first protrusion Ja and the second protrusion Jb. Note that, in FIG. 9, the hole-injection layer 1, the hole-transport layer 2, the electron-transport layer 4, and the electron-injection layer 5 are omitted. The common functional layer including the hole-injection layer 1, the hole-transport layer 2, the electron-transport layer 4, and the electron-injection layer 5 is separated at the first protrusion Ja and the second protrusion Jb as the second electrode 24 is. Furthermore, in a region in which the second interlayer 17 provided as the first inorganic film and the lower second inorganic insulating film 36 provided as the second inorganic insulating film are overlapped with the first protrusion Ja and the second protrusion Jb in plan view, the second interlayer insulating film 17 and the lower second inorganic insulating film 36 are in contact with each other as illustrated in FIG. 9. Moreover, a space V is provided between (i) the first protrusion Ja and the second protrusion Jb and (ii) at least one of the upper second inorganic insulating film 38 and the lower second inorganic insulating film 36. Note that FIG. 9 shows as an example a configuration in which the space V is provided between (i) the first protrusion Ja and the second protrusion Jb and (ii) the upper second inorganic insulating film 38. Alternatively, the space V may be provided between (i) the first protrusion Ja and the second protrusion Jb and (ii) the lower second inorganic insulating film 36, or between (i) the first protrusion Ja and the second protrusion Jb and (ii) the upper second inorganic insulating film 38 and the lower second inorganic insulating film 36. The upper second inorganic insulating film 38 illustrated in FIG. 9 is provided over the separation wall Ea. The lower second inorganic insulating film 36 illustrated in FIG. 9 is separated at the first protrusion Ja and the second protrusion Jb.

Furthermore, as illustrated in FIGS. 8 and 9, the organic EL display device 50a includes in the non-display region N: an inner first dam wall We and an inner second dam wall Wd each shaped into a frame along the periphery of the separation wall Ea, and provided to the separation wall Ea toward the display region D.

The inner first dam wall We illustrated in FIG. 9 includes: a first resin layer 19e formed of the same material, and in the same layer, as the planarization film 19a is; and a second resin layer 22e provided on the first resin layer 19e and formed of the same material, and in the same layer, as the edge cover 22a is. Here, as illustrated in FIG. 9, the inner first dam wall We overlaps the peripheral end of the organic insulating film 37 in the non-display region N toward the display region D.

The inner second dam wall Wd illustrated in FIG. 9 includes: a first resin layer 19f formed of the same material, and in the same layer, as the planarization film 19a is; and a second resin layer 22f provided on the first resin layer 19f and formed of the same material, and in the same layer, as the edge cover 22a is. Here, as illustrated in FIG. 9, the inner second dam wall Wd is provided in the non-display region N and between the inner first dam wall We and the separation wall Ea.

In the non-display region N, the gate insulating film 13, the first interlayer insulating film 15, and the second interlayer insulating film 17 illustrated in FIG. 9 are provided not to reach an end face of the through hole H. Here, as illustrated in FIG. 9, provided to an edge of the through hole H is a semiconductor layer 12c as an etch stopper. The semiconductor layer 12c is exposed from the gate insulating film 13, the first interlayer insulating film 15, and the second interlayer insulating film 17. Note that the semiconductor layer 12c is formed of the same material, and in the same layer, as the semiconductor layers 12a and 12b are. FIG. 9 shows as an example a case where the base coat film 11 and the semiconductor layer 12c are left at the edge of the through hole H and provided as an inorganic film of the TFT layer 20. Alternatively, the base coat film 11 alone may be left. Still alternatively, the base coat film 11 and the semiconductor layer 12c may be provided not to reach the end face of the through hole H, and the resin substrate layer 10 may be exposed. Here, at the edge of the through hole H, the inorganic film may be formed thinly not to let a crack propagate into the inorganic film.

The above organic EL display device 50a displays an image as follows: In each sub-pixel P, a gate signal is input through the gate line 14 to the first TFT 9a. The first TFT 9a turns ON. Through the source line 18f, a data signal is written in the gate electrode 14b of the second TFT 9b and the capacitor 9c. A current in accordance with a gate voltage of the second TFT 9b is supplied from the power source line 18g to the organic EL layer 23. Hence, the light-emitting layer 3 of the organic EL layer 23 emits light and displays the image. Note that, in the organic EL display device 50a, even if the first TFT 9a turns OFF, the gate voltage of the second TFT 9b is held in the capacitor 9c. Hence, the light-emitting layer 3 keeps emitting light until a gate signal of the next frame is input.

Note that this embodiment describes as an example the organic EL display device 50a provided with the separation wall Ea in the non-display region N. Instead of the separation wall Ea, the organic EL display device 50a may include separation walls Eb to Eg. FIGS. 10 to 15 are cross-sectional views of the separation walls Eb to Eg; that is, first to sixth modifications of the separation wall Ea included in the organic EL display device 50a.

Figure 10:
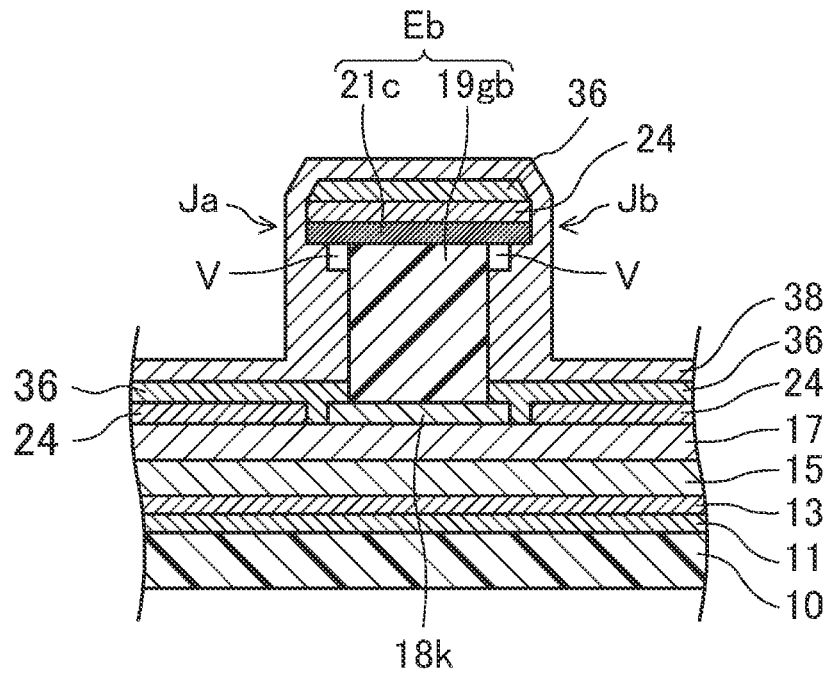
FIG. 10 is a cross-sectional view illustrating a first modification of a separation wall included in the organic EL display device according to the first embodiment of the disclosure.

As illustrated in FIG. 10, the separation wall Eb of the first modification includes: a first resin layer 19gb provided above the second interlayer insulating film 17 through a second metal layer 18k; and the first metal layer 21c provided on the first resin layer 19gb. The first resin layer 19gb is formed of the same material, and in the same layer, as the planarization film 19a is.

Furthermore, as illustrated in FIG. 10, the first metal layer 21c includes: the first protrusion Ja shaped into a canopy and protruding from the first resin layer 19gb toward the display region D; and the second protrusion Jb shaped into a canopy and protruding from the first resin layer 19gb toward the through hole H. Moreover, the second metal layer 18k is formed of the same material, and in the same layer, as the source line 18f is. Thanks to such features, the second metal layer 18k is provided between the second interlayer insulating film 17 and the first resin layer 19gb, making it possible to keep the separation wall Eb from coming off.

Figure 11:
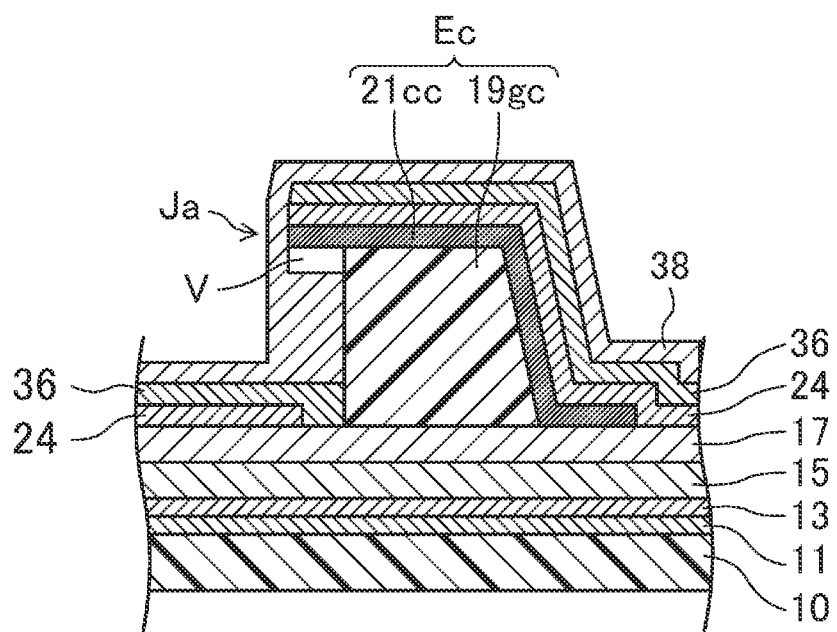
FIG. 11 is a cross-sectional view illustrating a second modification of the separation wall included in the organic EL display device according to the first embodiment of the disclosure.

As illustrated in FIG. 11, the separation wall Ec of the second modification includes: a first resin layer 19gc provided on the second interlayer insulating film 17; and a first metal layer 21cc provided on the first resin layer 19gc. The first resin layer 19gc is formed of the same material, and in the same layer, as the planarization film 19a is. As illustrated in FIG. 11, the first resin layer 19gc has a side face, to the through hole H, forward-tapered toward the resin substrate layer 10. Furthermore, as illustrated in FIG. 11, the first metal layer 21cc includes: the first protrusion Ja shaped into a canopy and protruding from the first resin layer 19gc toward the display region D. Moreover, the first metal layer 21cc is formed of the same material, and in the same layer, as the first electrode 21a is. As illustrated in FIG. 11, the first metal layer 21cc is provided to cover the side face, of the first resin layer 19gc, to the through hole H. Thanks to such features, the first metal layer 21cc, which is ductile, can keep a crack, in the upper second inorganic insulating film 38 and the lower second inorganic insulating film 36 at, for example, the through hole H, from propagating into the first resin layer 19gc.

Figure 12:
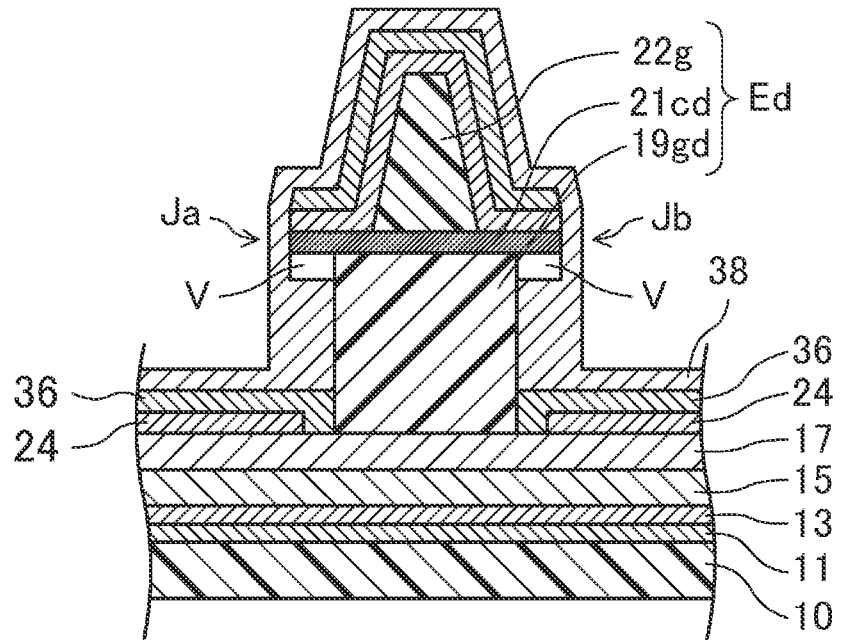
FIG. 12 is a cross-sectional view illustrating a third modification of the separation wall included in the organic EL display device according to the first embodiment of the disclosure.

As illustrated in FIG. 12, the separation wall Ed of the third modification includes: a first resin layer 19gd provided on the second interlayer insulating film 17; a first metal layer 21cd provided on the first resin layer 19gd; and a second metal layer 22g provided on the first metal layer 21cd. The first resin layer 19gd is formed of the same material, and in the same layer, as the planarization film 19a is. Furthermore, as illustrated in FIG. 12, the first metal layer 21cd includes: the first protrusion Ja shaped into a canopy and protruding from the first resin layer 19gd toward the display region D; and the second protrusion Jb shaped into a canopy and protruding from the first resin layer 19gd toward the through hole H. Moreover, the first metal layer 21cd is formed of the same material, and in the same layer, as the first electrode 21a is. Furthermore, the second resin layer 22g is formed of the same material, and in the same layer, as the edge cover 22a is. Thanks to such features, as illustrated in FIG. 12, the upper second inorganic insulating film 38 and the lower second inorganic insulating film 36 are provided to cover the second resin layer 22g. As a result, the features make it possible to keep a crack, in the upper second inorganic insulating film 38 and the lower second inorganic insulating film 36 at, for example, the through hole H, from propagating toward, the display region D.

Figure 13:
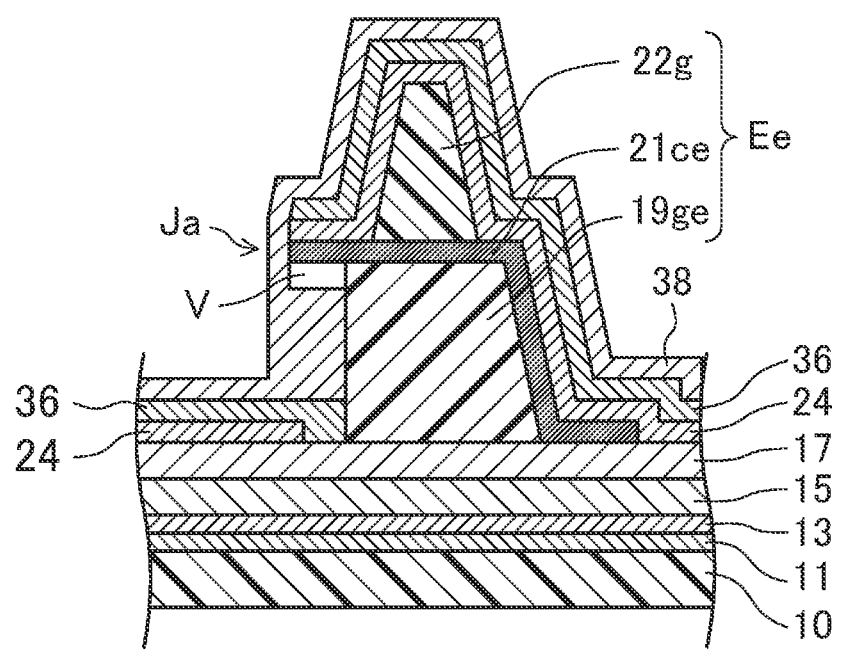
FIG. 13 is a cross-sectional view illustrating a fourth modification of the separation wall included in the organic EL display device according to the first embodiment of the disclosure.

As illustrated in FIG. 13, the separation wall Ee of the fourth modification includes: a first resin layer 19ge provided on the second interlayer insulating film 17; a first metal layer 21ce provided on the first resin layer 19ge, and the second metal layer 22g provided on the first metal layer 21ce. The first resin layer 19ge is formed of the same material, and in the same layer, as the planarization film 19a is. As illustrated in FIG. 13, each of the first resin layer 19ge and the second resin layer 21g has a side face, to the through hole H, forward-tapered toward the resin substrate layer 10. Furthermore, as illustrated in FIG. 13, the first metal layer 21ce includes the first protrusion Ja shaped into a canopy and protruding from the first resin layer 19ge toward the display region D. Moreover, the first metal layer 21ce is formed of the same material, and in the same layer, as the first electrode 21a is. As illustrated in FIG. 13, the first metal layer 21ce is provided to cover the side face, of the first resin layer 19ge, to the through hole H. Thanks to such features, the first metal layer 21ce, which is ductile, makes it possible to keep a crack, in the upper second inorganic insulating film 38 and the lower second inorganic insulating film 36 at, for example, the through hole H, from propagating toward the first resin layer 19ge. Moreover, as illustrated in FIG. 13, the upper inorganic insulating film 38 and the lower second inorganic insulating film 36 are provided to cover the second resin layer 22g. Such a feature makes it possible to keep a crack, in the upper second inorganic insulating film 38 and the lower second inorganic insulating film 36 at, for example, the through hole H, from propagating toward the display region D.

Figure 14:
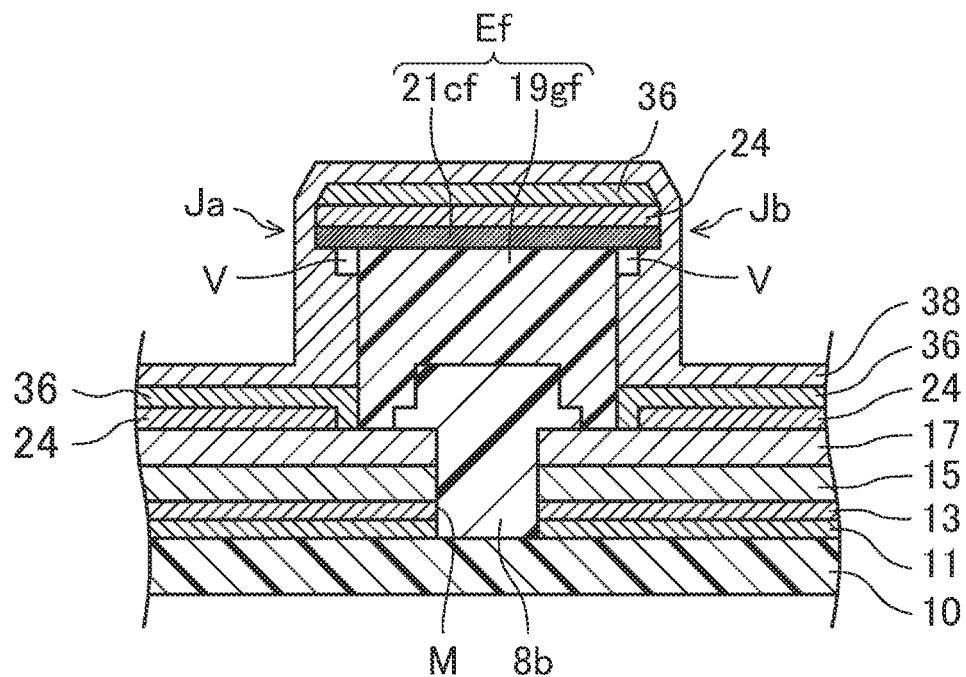
FIG. 14 is a cross-sectional view illustrating a fifth modification of the separation wall included in the organic EL display device according to the first embodiment of the disclosure.

As illustrated in FIG. 14, the separation wall Ef of the fifth modification includes: a third resin layer 8b provided to fill an opening M formed in the base coat film 11, the gate insulating film 13, the first interlayer insulating film 15, and the second interlayer insulating film 17; a first resin layer 19gf provided on the third resin layer 8b; and a first metal layer 21cf provided on the resin layer 19gf. Here, the opening M in FIG. 14 penetrates the base coat film 11, the gate insulating film 13, the first interlayer insulating film 15, and the second interlayer insulating film 17. The opening M is shaped into a frame to be overlapped with the separation wall Ef. The third resin layer 8b is formed of the same material, and in the same layer, as the lower planarization film 8a is. Furthermore, the first resin layer 19gf is formed of the same material, and in the same layer, as the planarization film 19a is. Moreover, the first metal layer 21cf is formed of the same material, and in the same layer, as the first electrode 21a is. As illustrated in FIG. 14, the first metal layer 21cf includes: the first protrusion Ja shaped into a canopy and protruding from the first resin layer 19gf toward the display region D; and the second protrusion Jb shaped into a canopy and protruding from the first resin layer 19gf toward the through hole H. Thanks to such features, the third resin layer 8b is provided to fill the opening M formed in the base coat film 11, the gate insulating film 13, the first interlayer insulating film 15, and the second interlayer insulating film 17. Hence, the features make it possible to keep a crack, in the base coat film 11, the gate insulating film 13, the first interlayer insulating film 15, and the second interlayer insulating film 17 at, for example, the through hole H, from propagating toward the display region D. Moreover, the third resin layer 8b is provided to be overlapped with the separation wall Ef. Even if the organic EL display device 50a adopts a structure to keep a crack from propagating, such a feature makes it possible to decrease a distance from the through hole H to a boundary between the non-display region N and the display region D. Note that this modification and the sixth modification below show, as an example, the opening M penetrating the base coat 11, the gate insulating film 13, the first interlayer insulating film 15, and the second interlayer insulating film 17. Alternatively, the opening M may be kept from opening in the base coat film 11, using a semiconductor layer as an etch stopper.

Figure 15:
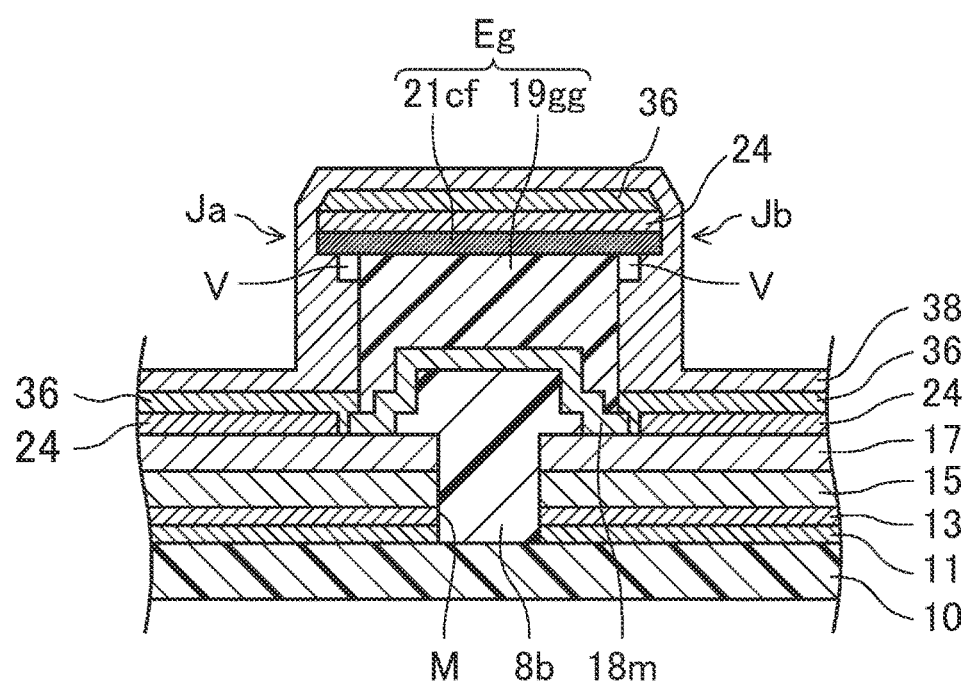
FIG. 15 is a cross-sectional view illustrating a sixth modification of the separation wall included in the organic EL display device according to the first embodiment of the disclosure.

As illustrated in FIG. 15, the separation wall Eg of the sixth modification includes: the third resin layer 8b provided to fill the opening M formed in the base coat film 11, the gate insulating film 13, the first interlayer insulating film 15, and the second interlayer insulating film 17; a first resin layer 19gg provided above the third resin layer 8b through a second metal layer 18m; and the first metal layer 21cf provided on the resin layer 19gg. Here, the second metal layer 18m is formed of the same material, and in the same layer, as the source line 18f is. Furthermore, the first resin layer 19gg is formed of the same material, and in the same layer, as the planarization film 19a is. Thanks to such features, the third resin layer 8b is provided to fill the opening M formed in the base coat film 11, the gate insulating film 13, the first interlayer insulating film 15, and the second interlayer insulating film 17. Hence, the features make it possible to keep a crack, in the base coat film 11, the gate insulating film 13, the first interlayer insulating film 15, and the second interlayer insulating film 17 at, for example, the through hole H, from propagating toward the display region D. Moreover, the third resin layer 8b is provided to be overlapped with the separation wall Eg. Even if the organic EL display device 50a adopts a structure to keep a crack from propagating, such a feature makes it possible to decrease a distance from the through hole H to a boundary between the non-display region N and the display region D. Furthermore, the second metal layer 18m, which is ductile, is provided between the third resin layer 8b and the first resin layer 19gg. Hence, even if a crack in the upper second inorganic insulating film 38 and the lower second inorganic insulating film 36 at, for example, the through hole H propagates to the first resin layer 19gg, the second metal layer 18k can keep the crack from propagating into the third resin layer 8b.

Note that this embodiment and the modifications show as examples the separation walls Ea to Eg. Alternatively, a separation wall of the disclosure may be formed in appropriate combination of the separation walls Eg to Eg. Moreover, described in this embodiment as an example is the organic EL display device 50a provided with one of the separation walls Ea to Eg in the non-display region N. Alternatively, two or more of the separation walls Ea to Eg may annularly be provided.

Figure 16:
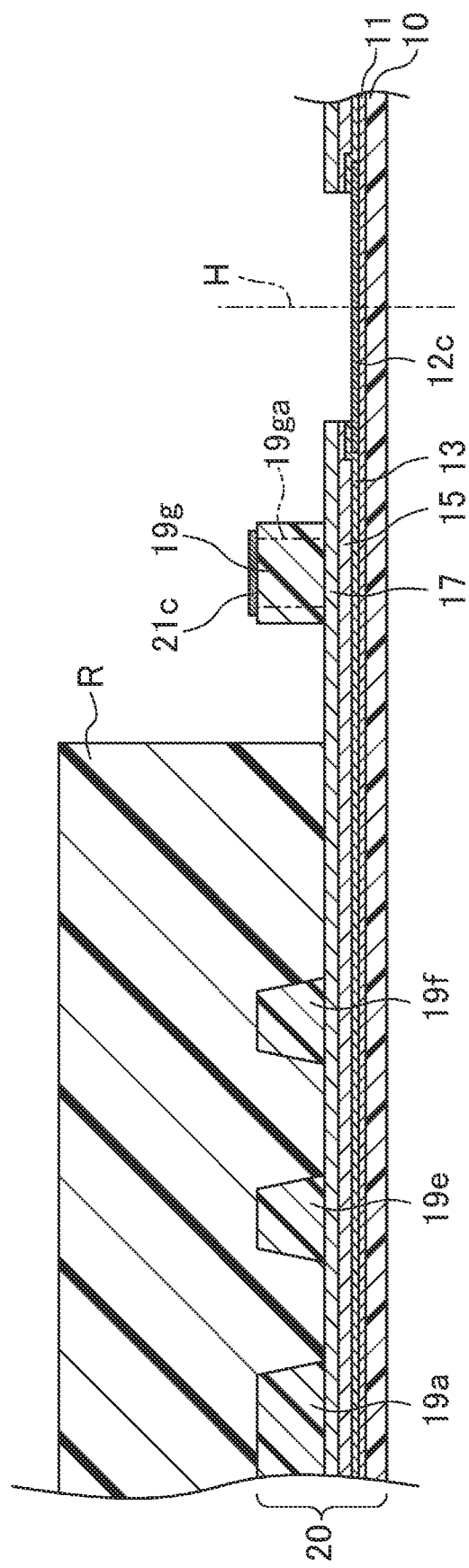
FIG. 16 is a cross-sectional view illustrating a method for producing the organic EL display device according to the first embodiment of the disclosure.

Described next is a method for producing the organic EL display device 50a of this embodiment. Note that the method for producing the organic EL display device 50a of this embodiment includes: forming TFT layer; forming organic EL element layer; forming sealing film; providing flexibility; and forming through hole. Note that FIG. 16 is a cross-sectional view illustrating a method for producing the organic EL display device 50a.

Forming TFT Layer

On a surface of the resin substrate layer 10 formed on a glass substrate, for example, the base coat film 11, the first TFTs 9a, the second TFTs 9b, the capacitors 9c, and the planarization film 19a are formed with a known technique to form the TFT layer 20.

Here, when the planarization film 19a is formed on the resin substrate layer 10, a separation wall formation layer 19g (see FIG. 16) shaped into a frame is formed in the non-display region N.

Forming Organic EL Element Layer

On the planarization film 19a of the TFT layer 20 formed in the forming of the TFT layer 20, the first electrode 21a, the edge cover 22a, the organic EL layer 23 (including the hole-injection layer 1, the hole-transport layer 2, the light-emitting layer 3, the electron-transport layer 4, and the electron-injection layer 5), and the second electrode 24 are formed with a known technique to form the organic EL element 25. This is how the organic EL element layer 30 is formed.

Here, when first electrode 21a is formed on the planarization film 19a, the first metal layer 21c is formed on the separation wall formation layer 19g. After that, as illustrated in FIG. 16, a resist R is formed to cover the first electrode 21a. Furthermore, a side face of the separation wall formation layer 19g exposed from the resist R is treated with a plasma ashing process using a gas mixture including a fluorinated gas and an oxygen gas, and the first resin layer 19ga is formed. Hence, the first protrusion Ja and the second protrusion Jb of the first metal layer 21c are formed to protrude from the first resin layer 19ga. After that, the resist R is removed, and the edge cover 22a, the organic EL layer 23, and the second electrode 24 are sequentially formed. Note that if the organic EL layer 23 and the second electrode 24 are formed by vapor-deposition, the organic EL layer 23, which includes the hole-injection layer 1, the hole-transport layer 2, the electron-transport layer 4, and the electron-injection layer 5, and the second electrode 24 are separated with a level difference at the first protrusion Ja and the second protrusion Jb.

Forming Sealing Film

First, on a surface of a substrate including the organic EL element 25 formed in the above forming of the organic EL element layer 30, an inorganic insulating film such as a silicon nitride film, a silicon oxide film, or a silicon nitride oxide film is deposited with, for example, the plasma chemical vapor deposition (CVD) using a mask to form the lower second inorganic film 36. Note that, when formed, the lower second inorganic insulating film 36 is separated with a level difference at the first protrusion Ja and the second protrusion Jb.

Next, on a surface of the substrate including the lower second inorganic film 36, an organic resin material such as acrylic resin is applied by, for example, ink jet printing to form the organic insulating film 37.

Moreover, on a substrate including the organic film 37, an inorganic insulating film such as a silicon nitride film, a silicon oxide film, or a silicon nitride oxide film is deposited as the upper second inorganic film 38 by the plasma CVD using a mask. Hence, the sealing film 40 is formed.

Providing Flexibility

To a surface of a substrate including the sealing film 40 formed in the above forming, a not-shown protective sheet is attached. After that, a laser beam is emitted on the glass substrate of the resin substrate layer 10 to remove the glass substrate from the bottom face of the resin substrate layer 10. Furthermore, to the bottom face of the resin substrate layer 10 with the glass substrate removed, a not-shown protective sheet is attached.

Forming Through Hole

In the above providing flexibility, the glass substrate is removed from the resin substrate layer 10. Provided to the resin substrate layer 10 is the frame-like (annular) separation wall Ea. For example, a laser beam is emitted to annularly scan a region provided behind the separation wall Ea and overlapping the semiconductor layer 12c. Thus, the through hole H is formed.

Through the above steps, the organic EL display device 50a of this embodiment can be produced.

As can be seen, in the organic EL display device 50a of this embodiment, the display region D has therein the non-display region N defined into a shape of an island and including the through hole H. The non-display region N includes the separation wall Ea shaped into a frame and provided along the edge of the through hole H. Here, the separation wall Ea includes: the first resin layer 19ga formed of the same material, and in the same layer, as the planarization film 19a is; and the first metal layer 21c provided on the first resin layer 19ga, and formed of the same material, and in the same layer, as the first electrode 21a is. The first metal layer 21c includes:

the first protrusion Ja shaped into a canopy and protruding from the first resin layer 19ga toward the display region D; and the second protrusion Jb shaped into a canopy and protruding from the first resin layer 19ga toward the through hole H. Hence, the common functional layers (i.e. the hole-injection layer 1, the hole-transport layer 2, the electron-transport layer 4, and the electro-injection layer 5) and the second electrode 24 are formed divided at the first protrusion Ja and the second protrusion Jb into portions each closer to one of the display region D and the through hole H. Thanks to such features, the common functional layers (i.e. the hole-injection layer 1, the hole-transport layer 2, the electron-transport layer 4, and the electron-injection layer 5) and the second electrode 24 can be formed divided into portions each closer to one of the display region D and the through hole H, without using a negatively photosensitive material and thus at low costs.

Moreover, as to the organic EL display device 50a of this embodiment, in the region overlapping the first protrusion Ja at the display region D in plan view, the second interlayer insulating film 17 of the TFT layer 20 and the lower second inorganic film 36 of the sealing film 40 are in contact with each other. Such a feature makes it possible to ensure sealability of the sealing film 40 and reduce deterioration of the organic EL elements 25.

Furthermore, as to the organic EL display device 50a of this embodiment, the space V is provided between (i) the first protrusion Ja and the second protrusion Jb and (ii) at least one of the upper second inorganic insulating film 38 and the lower second inorganic insulating film 36. Such a feature makes it possible to keep a crack, in the upper second inorganic insulating film 38 and the lower second inorganic insulating film 36 at the through hole H, from propagating toward the display region D.

SECOND EMBODIMENT

Figure 17:
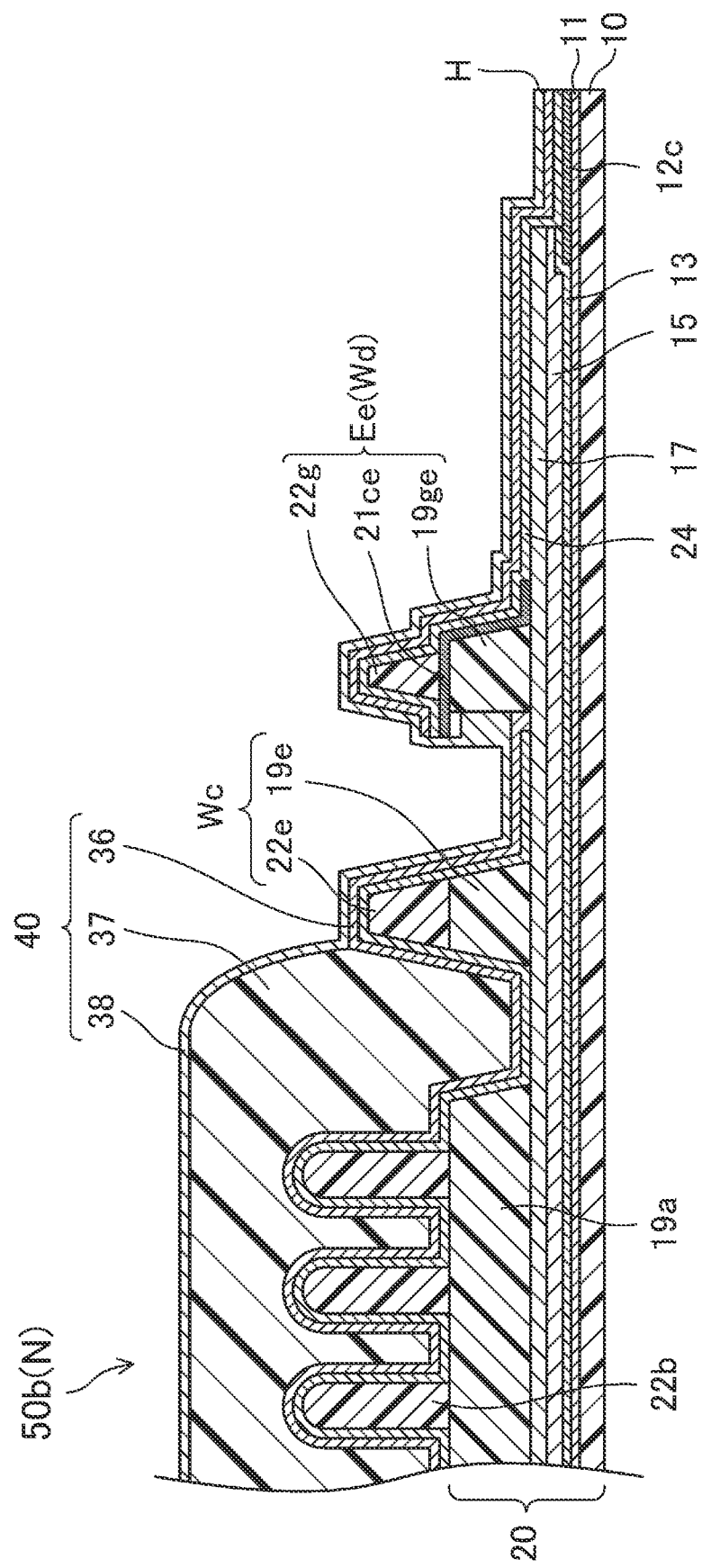
FIG. 17, corresponding to FIG. 9, is a cross-sectional view illustrating a non-display region of an organic EL display device according to a second embodiment of the disclosure.

FIG. 17 illustrates a second embodiment of a display device according to the disclosure. Here, FIG. 17, corresponding to FIG. 9, is a cross-sectional view illustrating the non-display region N of an organic EL display device 50b according to this embodiment. Note that, in the embodiments below, like reference signs designate identical or corresponding components in FIGS. 1 to 16. These components will not be elaborated upon.

In the first embodiment, the organic EL display device 50a described as an example includes the non-display region N provided with the inner first dam wall Wc, the inner second dam wall Wd, and the separation wall Ea. In the second embodiment, the organic EL display device 50b to be described as an example includes the non-display region N provided with the inner first dam wall We and a separation wall Ee that serves as the inner second dam wall Wd.

Similar to the organic EL display device 50a of the first embodiment, the organic EL display device 50b includes, for example: the display region D shaped into a rectangle and displaying an image; and the frame region F shaped into a rectangular frame and provided around the display region D.

Similar to the organic EL display device 50a of the first embodiment, the organic EL display device 50b includes: the resin substrate layer 10; the TFT layer 20 provided on the resin substrate layer 10; the organic EL element layer 30 provided on the TFT layer 20; and the sealing film 40 provided on the organic EL element layer.

The display region D and the frame region F of the organic EL display device 50b are substantially the same in configuration as the display region D and the frame region F of the organic EL display device 50a in the first embodiment.

As illustrated in FIG. 17, the organic EL display device 50b includes, in the non-display region N, the separation wall Ee shaped into a frame to serve as the inner second dam wall Wd, and provided along the edge of the through hole H (see the fourth modification in the first embodiment).

The organic EL display device 50b illustrated in FIG. 17 includes, in the non-display region N, the inner first darn wall We shaped into a frame along the periphery of the separation wall Ee, and provided to the separation wall Ee toward the display region D.

Similar to the organic EL display device 50a of the above first embodiment, the organic EL display device 50b is flexible, and allows, in each of the sub-pixels P, the light-emitting layer 3 of the organic EL layer 23 to appropriately emit light through the first TFTs 9a and the second TFTs 9b to display an image.

Note that, in this embodiment, the separation wall Ee serving as the inner second dam wall Wd is described as an example. Alternatively, the separation wall Ee serving as the inner second dam wall Wd may be replaced with the separation wall Ec described in the second modification of the first embodiment.

As can be seen, in the organic EL display device 50b of this embodiment, the display region D has therein the non-display region N defined into a shape of an island and including the through hole H. The non-display region N includes the separation wall Ea shaped into a frame and provided along the edge of the through hole H. Here, the separation wall Ee includes: the first resin layer 19ge formed of the same material, and in the same layer, as the planarization film 19a is; and the first metal layer 21ce provided on the first resin layer 19ge, and formed of the same material, and in the same layer, as the first electrode 21a is. Furthermore, the first metal layer 21ce includes the first protrusion Ja shaped into a canopy and protruding from the first resin layer 19ge toward the display region D. Hence, the common functional layers (i.e. the hole-injection layer 1, the hole-transport layer 2, the electron-transport layer 4, and the electron-injection layer 5) and the second electrode 24 are formed divided at the first protrusion Ja into portions each closer to one of the display region D and the through hole H. Thanks to such features, the common functional layers (i.e. the hole-injection layer 1, the hole-transport layer 2, the electron-transport layer 4, and the electron-injection layer 5) and the second electrode 24 can be formed divided into portions each closer to one of the display region D and the through hole H, without using a negatively photosensitive material and thus at low costs.

Moreover, as to the organic EL display device 50b of this embodiment, in the region overlapping the first protrusion Ja at the display region D in plan view, the second interlayer insulating film 17 of the TFT layer 20 and the lower second inorganic insulating film 36 of the sealing film 40 are in contact with each other. Such a feature makes it possible to ensure sealability of the sealing film 40 and reduce deterioration of the organic EL elements 25.

Furthermore, as to the organic EL display device 50b of this embodiment, the space V is provided between the first protrusion Ja and at least one of the upper second inorganic insulating film 38 and the lower second inorganic insulating film 36. Such a feature makes it possible to keep a crack, in the upper second inorganic insulating film 38 and the lower second inorganic insulating film 36 at the through hole H, from propagating toward the display region D.

In addition, as to the organic EL display device 50b of this embodiment, the separation wall Ee also serves as the inner second dam wall Wd. Such a feature makes it possible to decrease a distance from the through hole H to a boundary between the non-display region N and the display region D.

THIRD EMBODIMENT

Figure 18:
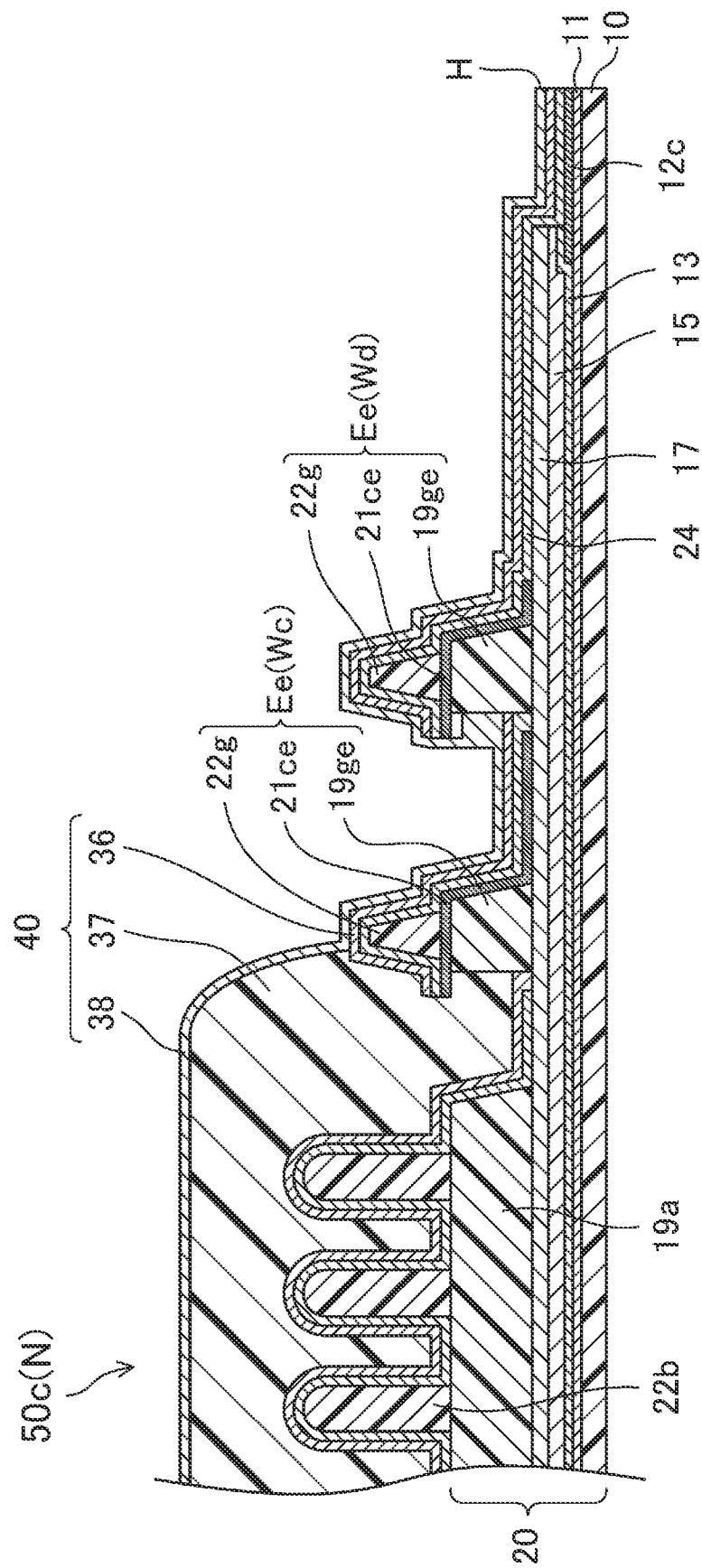
FIG. 18, corresponding to FIG. 9, is a cross-sectional view illustrating a non-display region of an organic EL display device according to a third embodiment of the disclosure.

FIG. 18 illustrates a third embodiment of a display device according to the disclosure. Here, FIG. 18, corresponding to FIG. 9, is a cross-sectional view illustrating the non-display region N of an organic EL display device 50c according to this embodiment.

In the first embodiment, the organic EL display device 50a described as an example includes the non-display region N provided with the inner first dam wall Wc, the inner second dam wall Wd, and the separation wall Ea. In the third embodiment, the organic EL display device 50c to be described as an example includes the non-display region N provided with separation walls Ee each serving as one of the inner first dam wall Wc and the inner second dam wall Wd.

Similar to the organic EL display device 50a of the first embodiment, the organic EL display device 50c includes, for example, the display region D shaped into a rectangle and displaying an image, and the frame region F shaped into a rectangular frame and provided around the display region D.

Similar to the organic EL display device 50a of the first embodiment, the organic EL display device 50c includes:

the resin substrate layer 10; the TFT layer 20 provided on the resin substrate layer 10; the organic EL element layer 30 provided on the TFT layer 20; and the sealing film 40 provided on the organic EL element layer.

The display region D and the frame region F of the organic EL display device 50c are substantially the same in configuration as the display region D and the frame region F of the organic EL display device 50a in the first embodiment.

As illustrated in FIG. 18, the organic EL display device 50c includes, in the non-display region N, one separation wall Ee shaped into a frame to serve as the inner second dam wall Wd, and provided along the edge of the through hole H (see the fourth modification in the first embodiment).

The organic EL display device 50c illustrated in FIG. 18 includes, in the non-display region N, an other separation wall Ee (Wc) shaped into a frame to serve as the inner second dam wall Wc, and provided to the separation wall Ee (Wd) toward the display region D and along the periphery of the separation wall Ee (Wd).

Similar to the organic EL display device 50a of the above first embodiment, the organic EL display device 50c is flexible, and allows, in each of the sub-pixels P, the light-emitting layer 3 of the organic EL layer 23 to appropriately emit light through the first TFTs 9a and the second TFTs 9b to display an image.

Note that, as an example in this embodiment, one of the separation walls Ee serves as the inner second dam wall Wd. Alternatively, the separation wall Ee serving as the inner second dam wall Wd may be replaced with the separation wall Eg described in the sixth modification of the first embodiment.

As can be seen, in the organic EL display device 50c of this embodiment, the display region D has therein the non-display region N defined into a shape of an island and including the through hole H. The non-display region N includes the separation walls Ee each shaped into a frame and provided along the edge of the through hole H. Here, each of the separation walls Ee includes: the first resin layer 19ge formed of the same material, and in the same layer, as the planarization film 19a is; and the first metal layer 21ce provided on the first resin layer 19ge, and formed of the same material, and in the same layer, as the first electrode 21a is. Furthermore, the first metal layer 21ce includes the first protrusion Ja shaped into a canopy and protruding from the first resin layer 19ge toward the display region D. Hence, the common functional layers (i.e.

the hole-injection layer 1, the hole-transport layer 2, the electron-transport layer 4, and the electron-injection layer 5) and the second electrode 24 are formed divided at the first protrusion Ja into portions each closer to one of the display region D and the through hole H. Thanks to such features, the common functional layers (i.e. the hole-injection layer 1, the hole-transport layer 2, the electron-transport layer 4, and the electron-injection layer 5) and the second electrode 24 can be formed divided into portions each closer to one of the display region D and the through hole H, without using a negatively photosensitive material and thus at low costs.

Moreover, as to the organic EL display device 50c of this embodiment, in the region, of the separation wall Ee (Wd), overlapping the first protrusion Ja at the display region D in plan view, the second interlayer insulating film 17 of the TFT layer 20 and the lower second inorganic insulating film 36 of the sealing film 40 are in contact with each other. Such a feature makes it possible to ensure sealability of the sealing film 40 and reduce deterioration of the organic EL elements 25.

Furthermore, as to the organic EL display device 50c of this embodiment, the space V is provided in the separation wall Ee (Wd) between the first protrusion Ja and at least one of the upper second inorganic insulating film 38 and the lower second inorganic insulating film 36. Such a feature makes it possible to keep a crack, in the upper second inorganic insulating film 38 and the lower second inorganic insulating film 36 at the through hole H, from propagating toward the display region D.

In addition, as to the organic EL display device 50c of this embodiment, each of the separation walls Ee also serves as one of the inner second dam wall Wc and the inner second dam wall Wd. Such a feature makes it possible to decrease a distance from the through hole H to a boundary between the non-display region N and the display region D.

Other Embodiments

In the above embodiments, the organic EL layer is formed of a multilayer including such five layers as the hole-injection layer, the hole-transport layer, the light-emitting layer, the electron-transport layer, and the electron-injection layer. Alternatively, the organic EL layer may be formed of a multilayer including such three layers as a hole-injection and hole-transport layer, the light-emitting layer, and an electron-transport and electron-injection layer.

Moreover, in the organic EL display devices of the above embodiments described as examples, the first electrode is an anode and the second electrode is a cathode. Alternatively, the disclosure is applicable to an organic EL display device including an organic EL layer whose multilayered structure is inverted so that the first electrode is a cathode and the second electrode is an anode.

Furthermore, in the organic EL display devices of the above embodiments described as examples, the electrodes of the TFTs connected to the first electrodes are drain electrodes. Alternatively, the disclosure is applicable to an organic EL display device in which the electrodes of the TFTs connected to the first electrodes are referred to as source electrodes.

In addition, in the organic EL display devices 50a to 50c of the above embodiments described as examples, the through hole H is shaped into a circle in plan view. Alternatively, the through hole H may be, for example, shaped into such a polygon as a rectangle in plan view.

Moreover, the above embodiments describe as examples the organic EL display devices 50a to 50c each including the sealing film 40 in which the organic insulating film 37 is provided between the lower second inorganic insulating film 36 and the upper second inorganic insulating film 38. Alternatively, this disclosure can also be applied to an organic EL display device including an organic vapor-deposited film formed between the lower second inorganic insulating film 36 and the upper second inorganic insulating film 38, and the organic vapor-deposited film is treated with a plasma ashing process to coat foreign substances. Even if foreign substances are found on the display region, such a sealing film can ensure sealability with the upper second inorganic insulating film, making it possible to improve reliability.

Furthermore, the above embodiments describe as examples organic EL display devices as display devices. However, the display devices shall not be limited to organic EL display devices. The disclosure is applicable to flexible display devices. For example, the disclosure is applicable to a flexible display device including quantum-dot light emitting diodes (QLEDs); that is, light-emitting elements using layers containing quantum dots.

INDUSTRIAL APPLICABILITY

As can be seen, the present invention is applicable to a flexible display device.

The invention claimed is:
1. A display device comprising:
a base substrate;
a thin-film transistor layer provided on the base substrate, the thin-film transistor layer including at least one first inorganic insulating film, and having a surface on which a planarization film is stacked;
a light-emitting element layer in which a plurality of light-emitting elements is arranged, the light-emitting element layer being provided on the thin-film transistor layer;
a sealing film, including at least one second inorganic insulating film, provided on the light-emitting element layer;
a display region defined to display an image;
a frame region defined around the display region;
a non-display region defined inside the display region and shaped into an island; and
a separation wall shaped into a frame and provided to the non-display region along an edge of a through hole of the non-display region,
each of the plurality of light-emitting elements including:
a first electrode;
a functional layer, and
a second electrode stacked on top of each other in a stated order,
the through hole penetrating the non-display region along a thickness of the base substrate,
the separation wall including:
a first resin layer formed of the same material, and in the same layer, as the planarization film; and
a first metal layer formed of the same material, and in the same layer, as the first electrode, and provided on the first resin layer, and
the first metal layer including a first protrusion shaped into a canopy and protruding from the first resin layer toward the display region.
2. The display device according to claim 1, wherein
the display region includes a plurality of sub-pixels,
the functional layer includes a common functional layer provided in common among the plurality of sub-pixels, and
the second electrode and the common functional layer are provided on the first metal layer from the display region to the through hole, and separated at the first protrusion.
3. The display device according to claim 2, wherein
in a region in which the at least one first inorganic insulating film and the at least one second inorganic insulating film are overlapped with the first protrusion in a plan view, the at least one first inorganic insulating film and the at least one second inorganic insulating film are in contact with each other.
4. The display device according to claim 1, wherein
the first metal layer further includes a second protrusion shaped into a canopy and protruding from the first resin layer toward the through hole.
5. The display device according to claim 1, wherein
the first resin layer has a side face, to the through hole, forward-tapered toward the base substrate.

6. The display device according to claim 1, wherein
the light-emitting element layer includes an edge cover provided to cover a peripheral end of the first electrode in each of the plurality of light-emitting elements, and
the separation wall further includes a second resin layer provided on the first metal layer, and formed of the same material, and in the same layer, as the edge cover.
7. The display device according to claim 6, wherein
each of the first resin layer and the second resin layer has a side face, to the through hole, forward-tapered toward the base substrate.
8. The display device according to claim 1, further comprising:
a second metal layer provided between the at least one first inorganic insulating film and the first resin layer.
9. The display device according to claim 1, wherein
the at least one first inorganic insulating film is provided with an opening shaped into a frame and penetrating the at least one first inorganic insulating film to be overlapped with the separation wall,
the opening is provided with a third resin layer to fill the opening, and
the separation wall is provided on the third resin layer.
10. The display device according to claim 9, further comprising:
a second metal layer provided between the third resin layer and the first resin layer.
11. The display device according to claim 1, wherein
the at least one second inorganic insulating film includes:
a lower second inorganic insulating film provided toward the base substrate; and
an upper second inorganic insulating film provided across from the base substrate, and
the sealing film further includes an organic insulating film provided between the lower second inorganic insulating film and the upper second inorganic insulating film.
12. The display device according to claim 11, further comprising:
a space provided between (i) the first protrusion and (ii) at least one of the upper second inorganic insulating film and the lower second inorganic insulating film.
13. The display device according to claim 11, wherein
the upper second inorganic insulating film is provided over the separation wall.
14. The display device according to claim 11, wherein
the lower second inorganic insulating film is separated at the first protrusion.
15. The display device according to claim 11, further comprising:
a dam wall included in the non-display area and shaped into a frame along a periphery of the separation wall, the dam wall being provided to the separation wall toward the display region and overlapping a peripheral end of the organic insulating film.
16. The display device according to claim 15, wherein
the light-emitting element layer includes an edge cover provided to cover a peripheral end of the first electrode in each of the plurality of light-emitting elements, and
the separation wall further includes a second resin layer provided on the first metal layer, and formed of the same material, and in the same layer, as the edge cover.
17. The display device according to claim 16, wherein
each of the first resin layer and the second resin layer has a side face, to the through hole, forward-tapered toward the base substrate.

18. The display device according to claim 11, wherein
the light-emitting element layer includes an edge cover
provided to cover a peripheral end of the first electrode
in each of the plurality of light-emitting elements, and
the separation wall further includes a second resin layer
provided on the first metal layer, and formed of the
same material, and in the same layer, as the edge cover,
the separation wall overlapping a peripheral end of the
organic insulating film.

19. The display device according to claim 18, wherein
each of the first resin layer and the second resin layer has
a side face, to the through hole, forward-tapered toward
the base substrate.

20. The display device according to claim 19, further
comprising:
another separation wall shaped into a frame and provided
between the separation wall and the through hole along
the edge of the through hole, the other separation wall
being the same in structure as the separation wall.

\* \* \* \* \*